(12) United States Patent
Rosenquist et al.

(10) Patent No.: US 6,188,323 B1
(45) Date of Patent: Feb. 13, 2001

(54) WAFER MAPPING SYSTEM

(75) Inventors: Frederick T. Rosenquist, Redwood City; Bruce Richardson, Pleasanton, both of CA (US); William J. Fosnight, Austin, TX (US); Anthony C. Bonora, Menlo Park, CA (US)

(73) Assignee: Asyst Technologies, Inc., Fremont, CA (US)

( * ) Notice: Under 35 U.S.C. 154(b), the term of this patent shall be extended for 0 days.

(21) Appl. No.: 09/173,710

(22) Filed: Oct. 15, 1998

(51) Int. Cl.⁷ .................................................. G08B 21/00
(52) U.S. Cl. ..................... 340/686.5; 250/561; 414/331
(58) Field of Search ........................ 340/686.5, 686.2, 340/686.1, 545.6, 545.7, 545.8, 545.9, 555, 556, 557, 545.1; 250/561, 223 R; 414/331, 411, 416, 936–940

(56) References Cited

U.S. PATENT DOCUMENTS

| | | | |
|---|---|---|---|
| 4,532,970 | * | 8/1985 | Tullis et al. .............................. 141/98 |
| 4,534,389 | * | 8/1985 | Tullis ....................................... 141/98 |
| 4,895,486 | * | 1/1990 | Baker et al. ........................... 414/331 |
| 4,955,780 | * | 9/1990 | Shimane et al. ...................... 414/744 |
| 4,987,407 | * | 1/1991 | Lee ......................................... 340/540 |
| 5,225,691 | * | 7/1993 | Powers et al. ......................... 250/561 |
| 5,308,993 | | 5/1994 | Holman et al. . |
| 5,319,216 | * | 6/1994 | Mokuo et al. ......................... 250/561 |
| 5,350,899 | * | 9/1994 | Ishikawa et al. ..................... 219/494 |
| 5,772,386 | * | 6/1998 | Mages et al. .......................... 414/411 |
| 5,851,102 | * | 12/1998 | Okawa et al. ......................... 414/783 |

* cited by examiner

Primary Examiner—Nina Tong
(74) Attorney, Agent, or Firm—Fliesler Dubb Meyer & Lovejoy LLP

(57) ABSTRACT

A wafer mapping system is disclosed mounted to the port door of a process tool. As the port door is lowered away from the access port of the process tool in order to allow wafer transfer through the port, the wafer mapping system according to the present invention detects the presence and position of the various wafers in the pod shell, which information may then be stored in memory for later use. As such, wafer mapping according to this system occurs without additional processing steps or time. The port door is lowered by a servo drive which allows the precise position of the port door to be identified at any given time. As such, the position of a wafer within the pod shell may be precisely identified by the wafer mapping system mounted on the port door as the door is lowered.

23 Claims, 20 Drawing Sheets

WAFER MAPPING SYSTEM

BACKGROUND OF THE INVENTION

1. Field of the Invention

The present invention relates to the processing of semiconductor wafers, and in particular to a system for detecting the presence and position of a wafer in a wafer slot of a cassette or pod, and for storing, or mapping, the position of the wafer in memory for later use.

2. Description of Related Art

A SMIF system proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transport, the gaseous media (such as air or nitrogen) surrounding the wafers is essentially stationary relative to the wafers, and by ensuring that particles from the ambient environment do not enter the immediate wafer environment.

A SMIF system has three main components: (1) minimum volume, sealed pods used for storing and transporting wafers and/or wafer cassettes; (2) an input/output (I/O) minienvironment located on a semiconductor processing tool to provide a miniature clean space (upon being filled with clean air) in which exposed wafers and/or wafer cassettes may be transferred to and from the interior of the processing tool; and (3) an interface for transferring the wafers and/or wafer cassettes between the SMIF pods and the SMIF minienvironment without exposure of the wafers or cassettes to particulates. Further details of one proposed SMIF system are described in the paper entitled "SMIF: A TECHNOLOGY FOR WAFER CASSETTE TRANSFER IN VLSI MANUFACTURING," by Mihir Parikh and Ulrich Kaempf, *Solid State Technology*, July 1984, pp. 111–115.

SMIF pods are in general comprised of a pod door which mates with a pod shell to provide a sealed environment in which wafers may be stored and transferred. So called "bottom opening" pods are known, where the pod door is horizontally provided at the bottom of the pod, and the wafers are supported in a cassette which is in turn supported on the pod door. It is also known to provide "front opening" pods, in which the pod door is located in a vertical plane, and the wafers are supported either in a cassette mounted within the pod shell, or to shelves mounted in the pod shell itself.

In order to transfer wafers between a SMIF pod and a process tool within a wafer fab, a pod is typically loaded either manually or automatedly onto a load port on a front of the tool. The process tool includes an access port which, in the absence of a pod, is covered by a port door. Once the pod is positioned on the load port, mechanisms within the port door unlatch the pod door from the pod shell and move the pod door and port door together into the process tool where the doors are then moved away from the wafer transfer path and stowed. The pod shell remains in proximity to the interface port so as to maintain a clean environment including the interior of the process tool and the pod shell around the wafers. A wafer handling robot within the process tool may thereafter access particular wafers supported in wafer slots in the pod or cassette for transfer between the pod and the process tool.

During fabrication, semiconductor wafers may undergo more than 300 process steps before the wafer is cut into individual integrated circuit chips, and the wafers must be transferred to and from the SMIF pod for each of these process steps. Each time a group of wafers are removed from and returned to a pod for the individual processes, there is a danger that one or more of the wafers will be damaged or destroyed. Silicon semiconductor wafers are extremely valuable, with each wafer costing upwards of one-thousand dollars. More significantly, as devices are formed on the wafer surfaces, the worth of a particular lot of wafers within a pod may exceed one-million dollars. It is therefore critical to avoid damage or loss to the wafers during fabrication.

One source of wafer damage is as a result of the wafer being improperly seated in the wafer slots within a pod or cassette. Wafers may be loaded into the slots of a pod or cassette either manually or automatedly, by for example a pick and place robot. Where the wafers are loaded into the wafer slots manually, there is a danger that the wafers will be "cross slotted" or "double slotted". A cross slotted wafer is one which is seated in a first slot on one side of the cassette or pod, and a second slot on the opposite side of the cassette or pod that is higher or lower than the first slot. The result is that the wafer is not horizontal or parallel to the other properly seated wafers in the cassette or pod. When a pick and place robot goes to access a cross slotted wafer, it is possible that the robot will collide with the wafer, and/or that the wafer will not properly seat on the robot. Either situation is likely to result in damage or destruction of the cross slotted wafer and possibly those around it. A double slotted wafer is a wafer that lies directly on top of another so that two wafers are located in a single set of wafer slots. This situation prevents processing on the wafers, and results in loss of one or both wafers.

Separate and apart from the issue of wafer damage due to improperly placed wafers, a pod or cassette may include several empty wafer slots. In this event, unless the absence of a wafer from a particular set of wafer slots is detected, time will be wasted in having the end effector of the pick and place robot enter the cassette to access a wafer that is not in fact there.

In order to prevent damage as a result of improperly positioned wafers, and in order to avoid a waste of time accessing phantom wafers, it is known to provide sensing systems to detect the presence and position of wafers in the wafer slots. This information may then be stored, as in a computer memory, to provide a wafer map for a particular pod or cassette for later use. The type and location of conventional wafer mapping systems varies in the prior art. Some conventional wafer mapping systems have utilized standalone stations for detecting the presence and position of wafers once the pod or cassette is loaded thereon. An example of such a system is disclosed in U.S. Pat. No. 5,225,691 to Powers et al. That reference discloses a pair of columns mounted to a base with the columns spaced apart sufficiently to receive a wafer cassette therebetween. One column houses a plurality of transmitters and the other column houses a plurality of receivers. After a wafer cassette is seated on the base between the columns, the presence, position and horizontal orientation of the wafers may be determined by turning on respective transmitters at different times. A drawback to systems such as disclosed in U.S. Pat. No. 5,225,691 is that these systems add significantly to the process time and cost of equipment. It is also possible that the wafers move after transport away from the mapping station so that the mapped position of a particular wafer may not be the position of the wafer at the next subsequent processing station.

In addition to standalone mapping stations, it is known to integrate a mapping system into a load port of a particular process tool. For example, U.S. Pat. No. 5,772,386 to Mages et al. discloses an indexing sensor mounted inside a processing tool which looks through the processing tool access port and into the pod to map wafers as the platform on which the wafers are mounted is indexed up and down along a vertical axis. Such a system would not work for front opening load port systems, which do not include indexers that move the wafer along the vertical axis during wafer transfer into the process tool.

In front opening systems, it is known to provide a wafer mapping system on a wafer handling end effector, which indexes along the vertical axis in order to provide presence and positional information about the wafers within a particular pod or cassette. However, these systems map the wafers within a pod in a separate step dedicated to wafer mapping after the port door has been opened and prior to accessing of the wafers. As such, these types of systems require additional processing steps and time in order to provide a map of the wafers within a pod or cassette.

SUMMARY OF THE INVENTION

It is therefore an advantage of the present invention to provide a wafer mapping system that is integrated into a load port, and provides wafer mapping functions without additional processing steps or time.

It is another advantage of the present invention to mount a wafer mapping system on a servo-driven port door so that the vertical position of the wafer mapping system may be identified at any point during its translation away from the process tool access port.

It is a further advantage of the present invention to provide a wafer mapping system which may be positioned within a pod shell or cassette.

It is a still further advantage of the present invention to provide a wafer mapping system for detecting the presence or absence of a wafer from a particular set of wafer slots.

It is a further advantage of the present invention to provide a wafer mapping system for detecting cross slotted wafers.

It is another advantage of the present invention to provide a wafer mapping system for detecting double slotted wafers.

It is a further advantage of the present invention to provide either electrical and/or passive mechanical driving mechanisms for extending and retracting portions of the mapping system into and from the pod shell or cassette.

It is a still further advantage of the present invention to provide a wafer mapping system capable of working with a wide variety of pod shells and cassettes.

These and other advantages are provided by the present invention which in general relates to various embodiments of a wafer mapping system mounted to the port door of a process tool. As the port door is lowered away from the access port of the process tool in order to allow wafer transfer through the port, the wafer mapping system according to the present invention detects the presence and position of the various wafers in the pod shell, which information may then be stored in memory for later use. As such, wafer mapping according to this system occurs without additional processing steps or time. The port door is lowered by a servo drive which allows the precise position of the port door to be identified at any given time. As such, the position of a wafer within the pod shell may be precisely identified by the wafer mapping system mounted on the port door as the door is lowered.

According to one embodiment of the present invention, the wafer mapping system includes a pair of fingers rotatably mounted to the top of the port door, toward the sides of the top edge. In a retracted position, the fingers lie above and behind the port door. The fingers are rotated to their extended position inside the pod shell after the port door has lowered sufficiently to avoid contact between the fingers and the pod shell. The wafer mapping system further includes a transmitter and receiver either mounted in the port door or on the ends of the fingers. In their extended position, the fingers transmit a beam of electromagnetic energy from the transmitter across a front of the pod shell and back to the receiver. As the port door and wafer mapping system move downward, a wafer in a wafer slot will break the beam and prevent receipt of the beam in the receiver. At this time, the elevation of the wafer will match the known elevation of the beam so that the position of the wafer may be mapped in memory. The duration of time the beam is blocked will also identify cross slotted and double slotted wafers.

According to a further embodiment of the present invention, the moving fingers may be omitted, and the beam from the transmitter instead reflected into and across the pod shell, and then back to the receiver by reflective strips provided in the rear of the pod shell. There may be one or two reflective strips in the pod shell which are angled so as to ensure the beam will be properly reflected back to the receiver. In a further embodiment of the present invention, the transmitter and receiver may be mounted on ears on opposite sides of the port door. In this embodiment, the port plate on either side of the process tool access port includes vertically oriented windows, so that, as the port door lowers behind the port plate, the transmitter may transmit the beam through the window on one side of the port, and the receiver may receive the beam back through the window on the opposite side of the port. In this embodiment, a pair of reflective strips are mounted on the load port outside of the pod shell and extend upward from the horizontal pod support surface. These strips are provided to reflect the beam from the transmitter through the pod and back to the receiver, so that a position of a wafer may be mapped upon the wafer breaking the beam. As above, the mapping system may also detect cross and double slotted wafers.

The above-described embodiments of the wafer mapping system comprise break-the-beam systems. The system detects the presence of a wafer at a particular elevation as a result of the beam being blocked from the receiver. A further alternative embodiment of the present invention comprises a retroreflective wafer mapping system including a pair of transmitter/receiver units. The transmitter of the transmitter/receiver unit transmits a beam into the interior of the pod shell as the port door moves downward. Upon encountering a wafer in a particular wafer slot, the beam is reflected back off the wafer edge to the receiver of the transmitter/receiver unit. Upon receiving the beam, the receiver causes the position of the wafer to be stored for later use. This system may comprise a pair of transmitter/receiver units to account for the situation where one of the units reflects off of the wafer notch (in which case the beam will not be reflected back to the receiver even though a wafer-present indication should result). Additionally, each of the transmitter/receiver units is adjustably mounted to the port door to ensure that the beam emitted from the transmitter is at a predetermined elevation above the port door and is parallel to the plane of the wafers in the pod shell.

BRIEF DESCRIPTION OF THE DRAWINGS

The present invention will now be described with reference to the figures in which.

DETAILED DESCRIPTION

The present invention will now be described with reference to FIGS. 1–20, which in general relate to a wafer mapping system for detecting the presence and position of wafers within wafer slots in a SMIF pod. Although the present invention is described with respect to a 300 mm, front opening SMIF pod having the wafer slots affixed directly to the pod shell, it is understood that the present invention may operate with any of various other containers including bottom opening pods and standalone wafer cassettes. Moreover, it is understood that the present invention may be used to sense presence and positional information for various workpieces transported in a pod or cassette, including semiconductor wafers, reticles and flat panel displays. It is further understood that the present invention complies with and allows compliance with all applicable SEMI standards.

Figure 1:
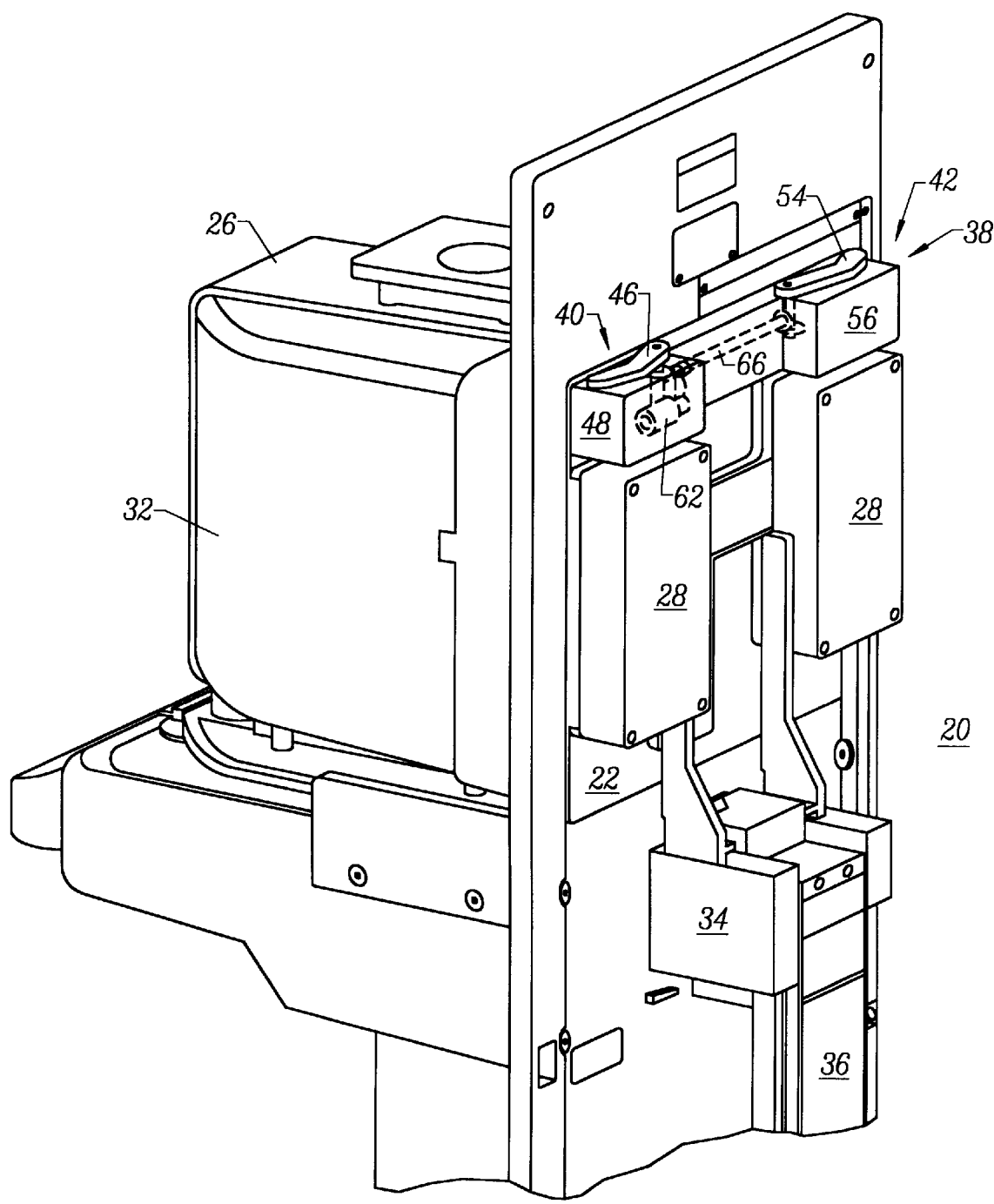
FIG. 1 is a rear perspective view of a port door positioned within an access port of a process tool, the port door including a wafer mapping system according to the present invention.
Figure 2:
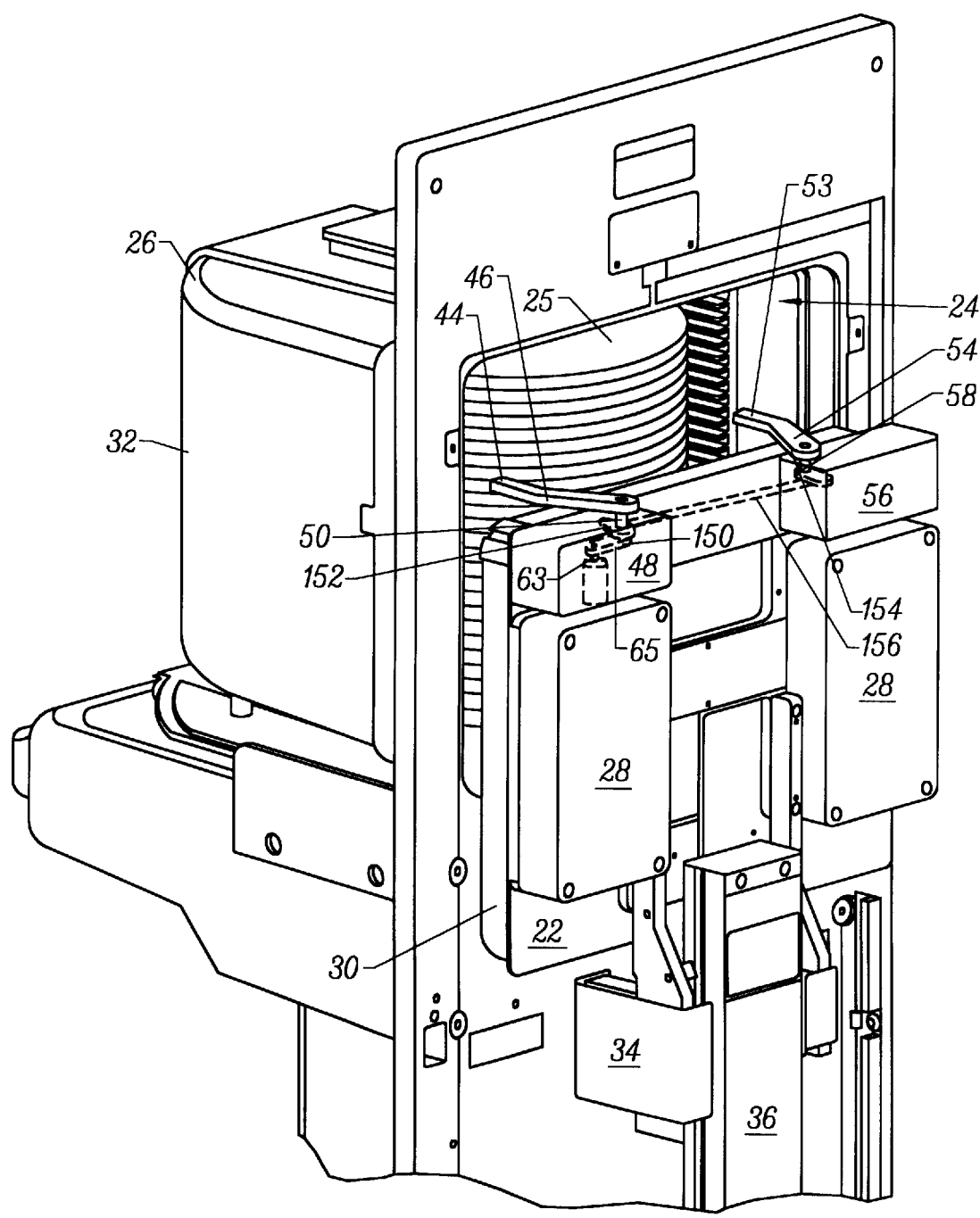
FIG. 2 is a rear perspective view of a port door partially removed from the access port of a process tool, the port door including a wafer mapping system according to the present invention.
Figure 3:
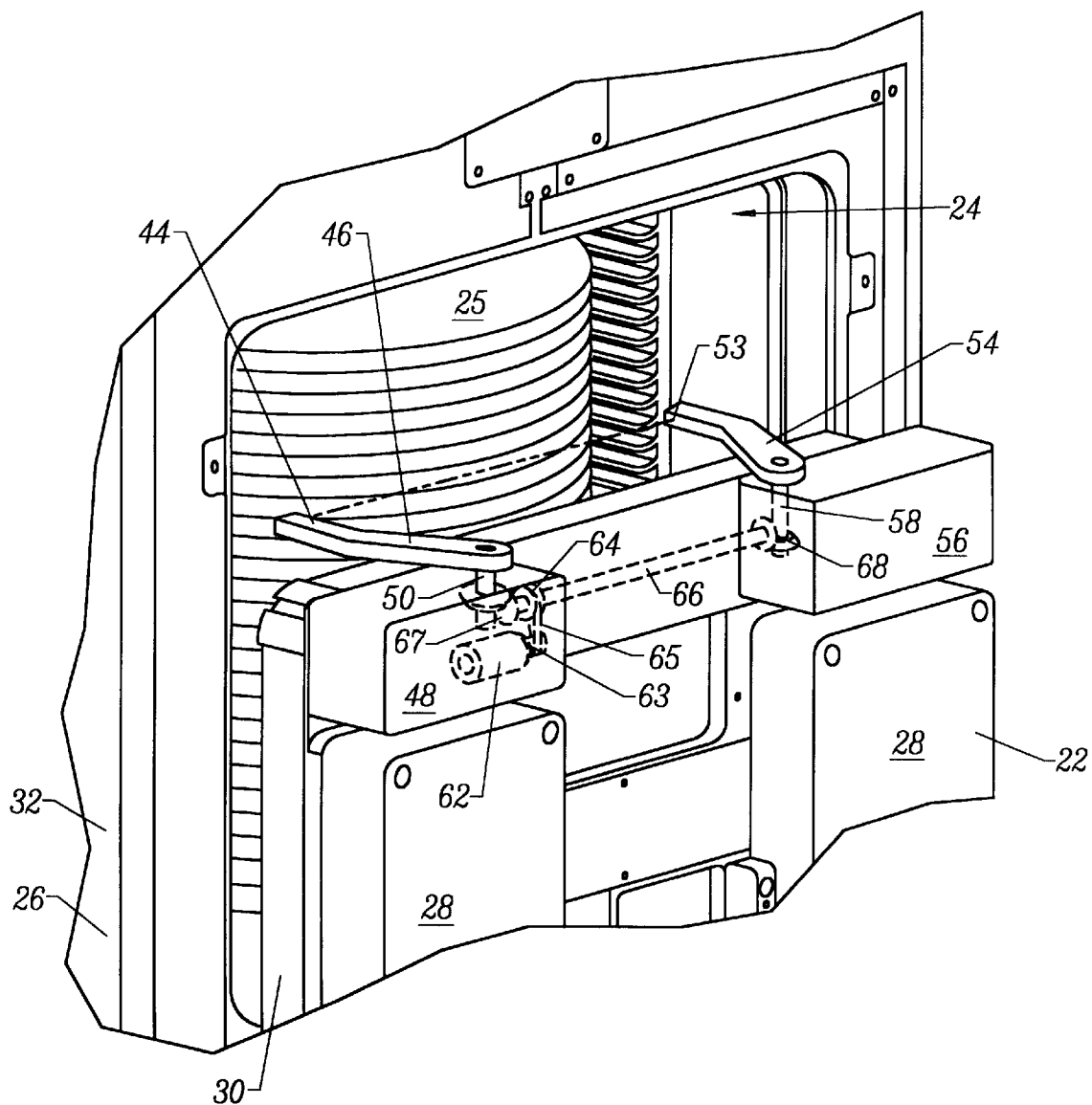
FIG. 3 is an enlarged rear perspective view showing the wafer mapping system according to an embodiment of the present invention.

Referring now to FIGS. 1–3, there are shown rear perspective views from the interior of a process tool 20 including a port door 22 for covering a tool access port 24 in the absence of a pod. As shown specifically in FIGS. 2 and 3, after a pod 26 is loaded onto the load port on the front of the process tool, mechanisms (not shown) housed within enclosures 28 decouple the pod door 30 from the pod shell 32 and couple the pod door 30 to the port door 22. After coupling of the pod door to the port door, a horizontal transfer mechanism 34 pulls the port and pod doors rearward out of the access port 24. Thereafter, a vertical transfer mechanism 36 moves the pod and port doors downward to clear a path through access port 24 so that wafers 25 may be transferred between the pod shell and the process tool. A wafer handling robot (not shown) may be provided within the process chamber for accomplishing the transfer of wafers between the pod shell and process tool.

The vertical transfer mechanism 36 preferably includes a servo drive that allows precise determination of the vertical position of the pod and port doors as they are moved down away from the access port. Although not critical to the present invention, the horizontal transfer mechanism 34 may also include a servo drive for precise monitoring of the horizontal position of the port door as it is removed from the access port 24. The servo drives of the vertical, and possibly the horizontal, transfer mechanisms may comprise respective motors, lead screws and a known servo device such as an encoder which allows precise monitoring of the horizontal and vertical movement of the port and pod doors by the transfer mechanisms. In a preferred embodiment, the encoder may be mounted to the rotational portion of the motor, but it may be mounted to a shaft of the lead screw in alternative embodiments. As a result of the servo drives, and in particular the servo drive on the vertical transfer mechanism 36, the precise vertical position of the port door 22 is known at any given time. Consequently, the vertical position of the wafer mapping system, mounted on the port door as explained hereinafter, is known at any given time.

With reference still to FIGS. 1–3, according to the present invention, a wafer mapping system 38 is mounted to the rear of the port door at or toward the top of the port door. According to a first embodiment of the present invention, the wafer mapping system 38 includes a transmitter assembly 40 and a receiver assembly 42. The transmitter assembly 40 includes a transmitter 44 mounted at the end of a finger 46. The finger 46 is mounted to a shaft 50 which is rotationally supported by a bearing (not shown) within a transmitter assembly housing 48. The transmitter emits a measurable beam of light. In a preferred embodiment, the light emitted from the transmitter 44 is generated by a laser diode (not shown) within the base, and is communicated to the transmitter in the end of finger 46 by fiberoptic carriers (not shown) through the shaft 50 and finger 46. It is understood that the light emitted from transmitter 44 may be at various frequencies including visible and invisible lightwave frequencies, and may comprise coherent or incoherent light as from a light emitting diode (LED), in alternative embodiments. It is also contemplated that the beam be comprised of soundwaves instead of lightwaves.

Receiver assembly 42 includes a receiver 53 provided within a finger 54. The finger 54 is affixed to a shaft 58 which is rotationally supported by a bearing (not shown) within a receiver assembly housing 56. The receiver 53 is configured to receive the beam emitted from transmitter 44, and generate a signal indicating receipt of the beam. This generated signal may then be communicated via fiberoptic carriers, electrical leads or wireless communication schemes (not shown) to a central processing unit (not shown) for processing and/or storage.

In a retracted position, the fingers 46 and 54 lie above and behind the port door as shown in FIG. 1. After the pod door and port door have been moved together out of the access port 24 and the vertical transfer mechanism 36 initiates translation of the port and pod doors downward, the fingers 46 and 54 are rotated about a vertical axis to their extended position within the pod shell as shown for example in FIGS. 2 and 3. The transmitter then emits the beam to the receiver 53, and, as the port and pod doors translate downward, wafers in the plane of the beam will break the beam. Breaking of a beam by a wafer indicates that the beam is in the plane of a wafer. The elevation of the port door at the time a wafer breaks the beam, as well as the length of time a beam is broken, are used as explained hereinafter to identify presence and positional information regarding the wafers in the pod.

The fingers 46 and 54 can only be rotated inward to their extended position once the fingers have been lowered sufficiently to be clear of the top of pod shell 32. At the same time, the fingers 46 and 54 must have rotated inward to their extended position in time to register information relating to a wafer that may be in the uppermost slot in the pod shell. The vertical transfer mechanism 36 normally transfers the port and pod doors downward at a rate of approximately 4 inches per second. However, it is contemplated that the vertical transfer mechanism 36 may slow down or come to a complete stop to allow sufficient time for the fingers to swing inward after clearing the top of the pod shell and still be in position to monitor a wafer in the top slot.

Figure 4:
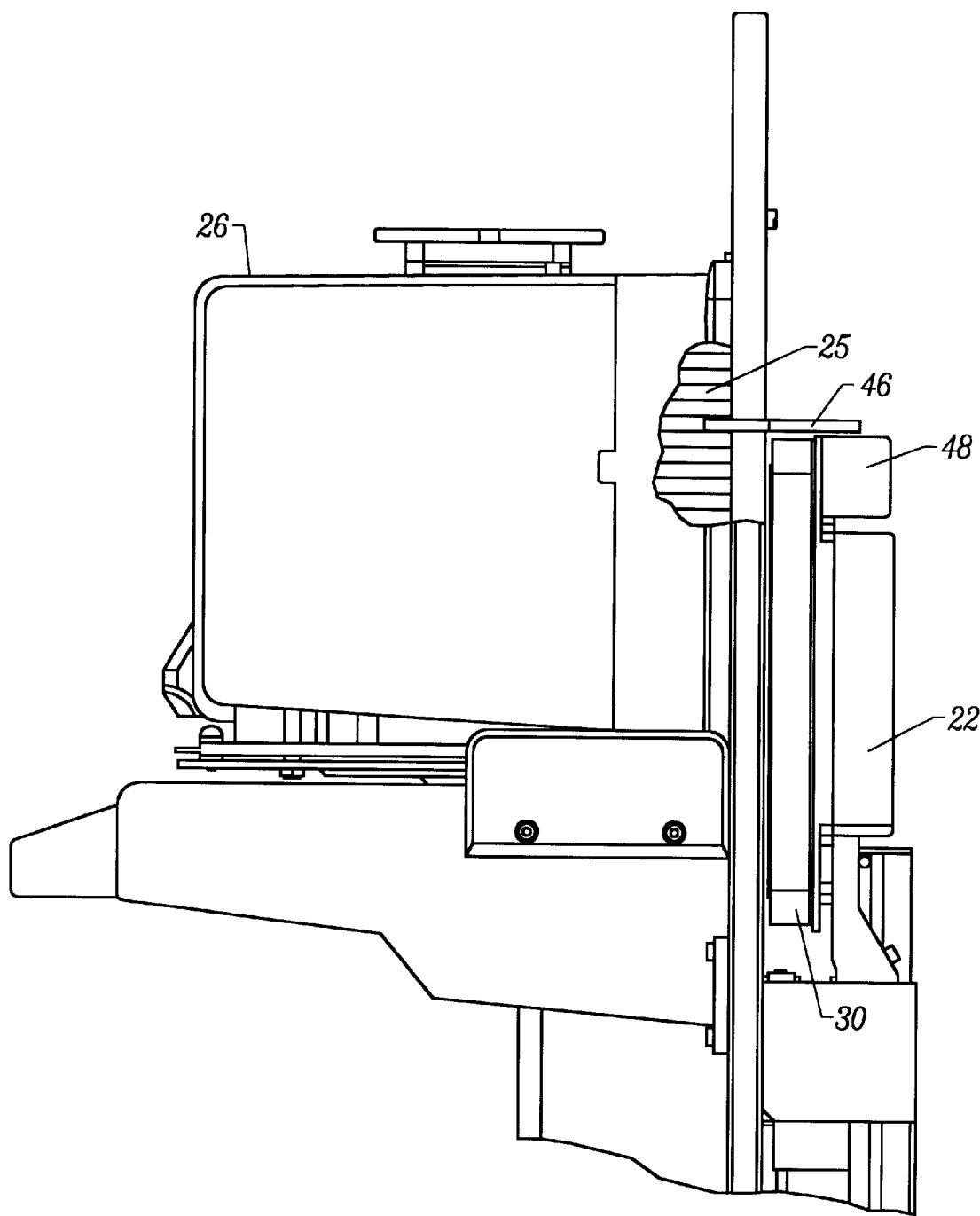
FIG. 4 is a partial side view of a pod loaded on a load port and a port door including a wafer mapping system according to an embodiment of the present invention.
Figure 5:
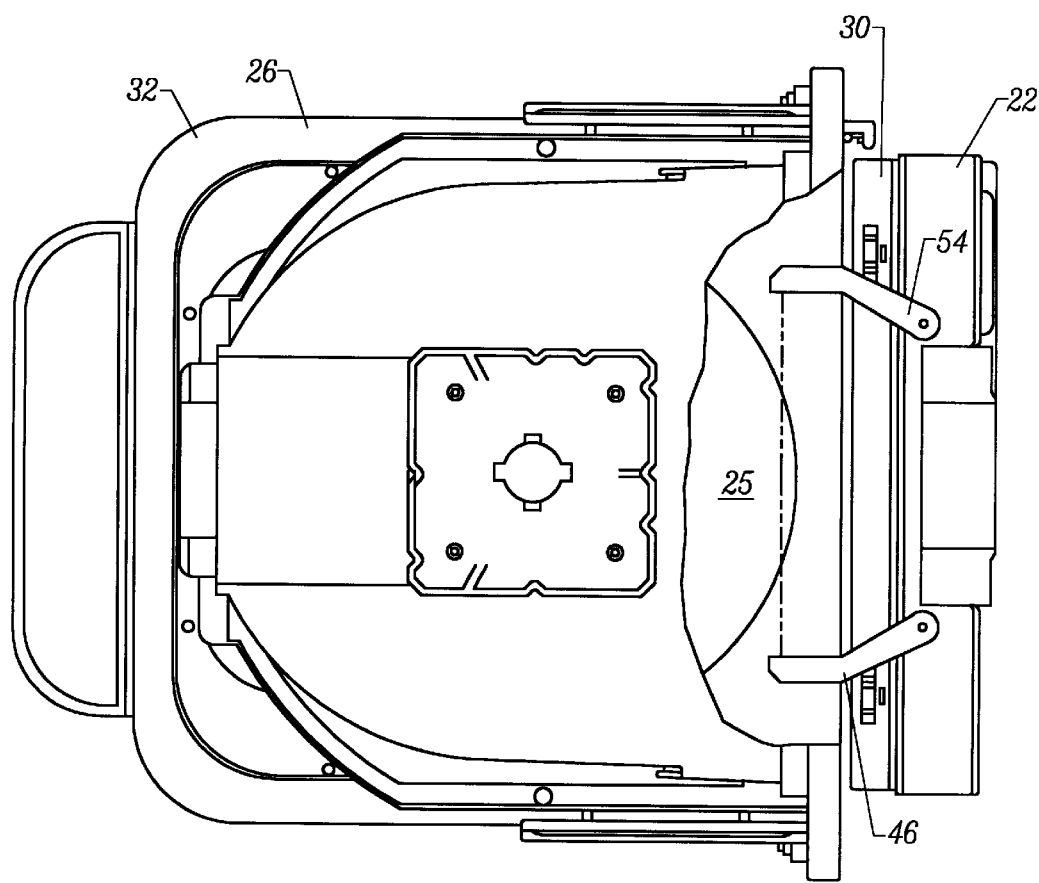
FIG. 5 shows a top view of the interior of a pod including the port door and wafer mapping system according to an embodiment of the present invention.

Referring now to FIGS. 4 and 5, in a preferred embodiment, the beam preferably passes across a wafer anywhere from 5 mm to 25 mm back from the front edge of the wafer, and optimally about 15 mm. As seen in FIG. 1, the mounting point of the fingers 46 and 54 is preferably toward the center of the port door, with the fingers extending out toward the sides of the port door. The fingers 46, 54 may thereafter swing inward away from the sides of the port door to their extended position when the port door is lowered to the sensing position as shown in FIG. 5. As would be appreciated by those of skill in the art, the angle to which the fingers are rotated from their retracted to extended position, as well as the length of the fingers, may be varied with the provision that the transmitted beam be positioned so that it is able to detect the presence and position of wafers within the cassette without the fingers contacting the wafers as the fingers move downward. It is understood that the distance of the beam back from the front edge of the wafers may be less than 5 mm and greater than 25 mm in alternative embodiments.

Figure 6:
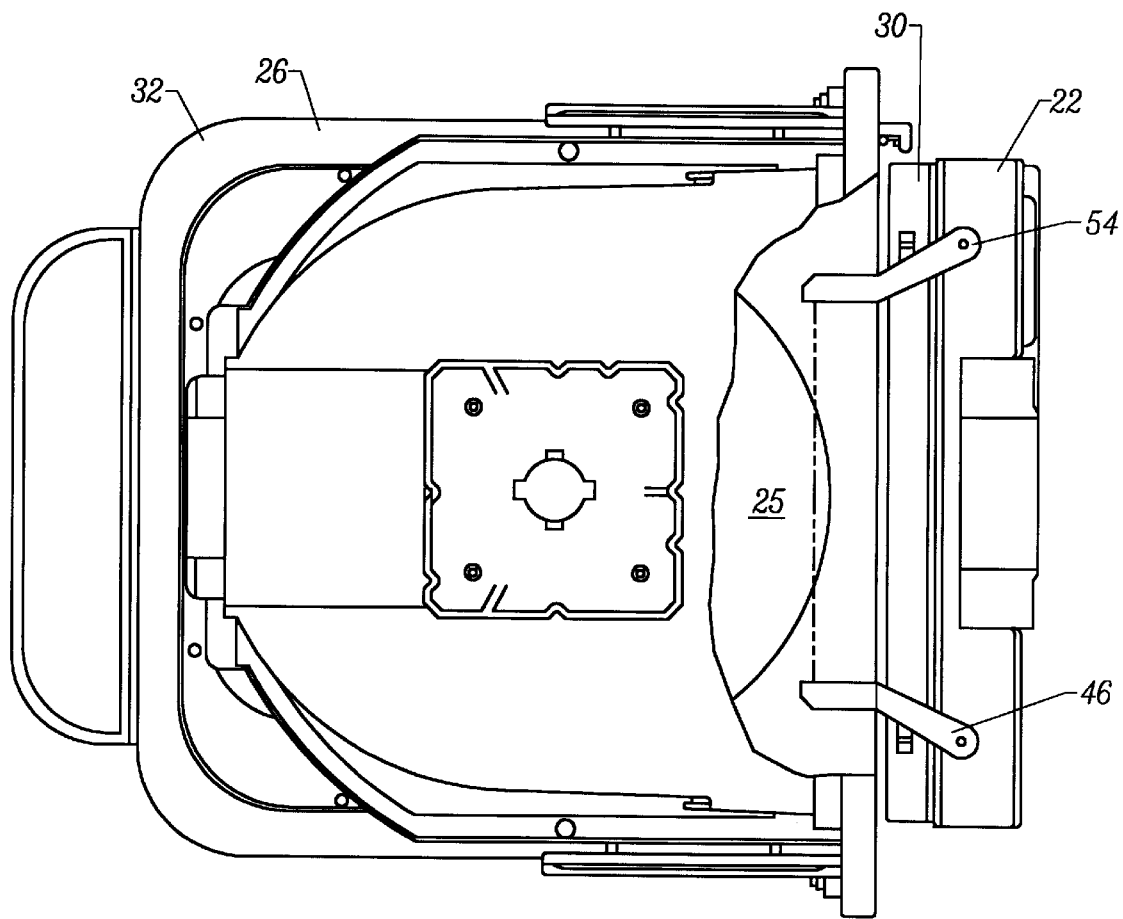
FIG. 6 is a top view of the interior of a pod showing the port door and wafer mapping system according to an alternative embodiment of the present invention.

As shown in FIG. 6, it is also contemplated that the fingers be pivotally mounted toward the sides of the port door and extend inward toward the center of the port door. However, regardless of where the fingers are mounted on the port door, in a preferred embodiment, the length of fingers 46 and 54 is provided so that the fingers can swing freely inward, and do not enter into the space either directly above, below or between wafers within the pod shell 32. This is true both in their fully extended position and while opening to their fully extended position. It is contemplated, however, that the arms would be long enough so as to enter into the space directly above, below or between the wafers while opening to their fully extended position in alternative embodiments. It is also possible that the horizontal transfer mechanism 34 move the port and pod doors rearward into the process tool an extra distance sufficient to allow longer fingers to rotate outward without entering the space of the wafers. Once the fingers are extended and located outside of the footprint of the wafers, the horizontal transfer mechanism would then move the port and pod doors horizontally forward to position the extended fingers in the pod shell along the side of the wafers.

Figure 7:
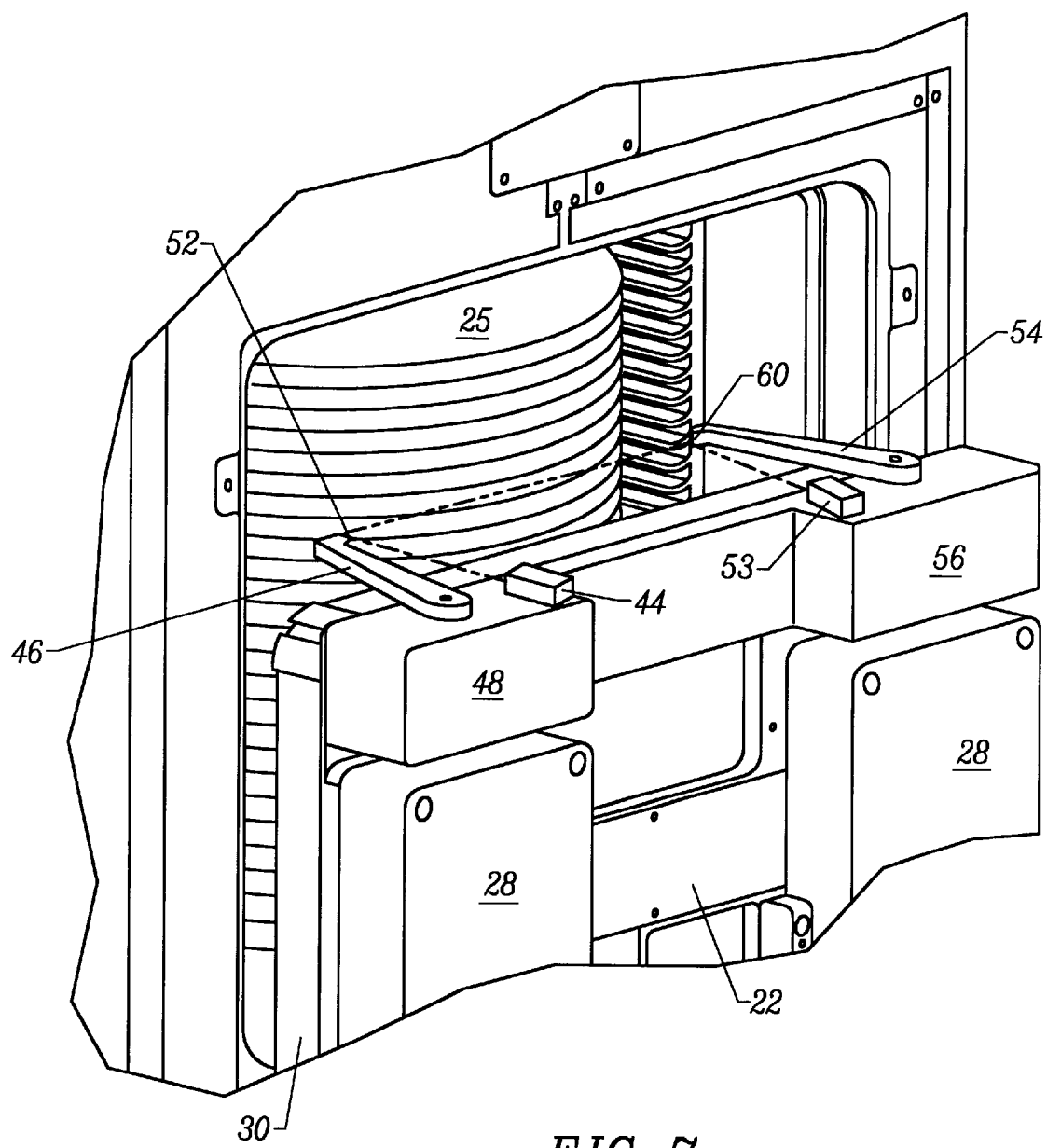
FIG. 7 is a perspective view of the interior of a pod showing the port door and wafer mapping system according to an alternative embodiment of the present invention.

According to an alternative embodiment shown in FIG. 7, it is contemplated that the transmitter 44 and receiver 53 be mounted on the port door. In this embodiment, the ends of the fingers 46 and 54 include mirrors 52 and 60, respectively. The mirrors are angled with respect to each other so that the mirror 52 receives the beam from the transmitter, redirects the beam across the front edge of the wafer to the mirror 60, which in turn redirects the beam to the receiver 53. It is understood that the angle of the mirrors 52 and 60 will vary depending on the angle to which the fingers are rotated out to their extended positions and the relative mounting positions of the fingers and the transmitter and receiver on the port door. It is further understood that other mechanisms may be used in the place of mirrors to redirect the beam as described above.

As discussed briefly above, with the fingers rotated into their extended positions, the wafer mapping system 38 will detect the presence and positional information with regard to each of the wafers within the pod shell. When a wafer breaks the beam, the elevation of the wafer (determined by the known elevation of the beam when broken) is stored, or mapped, in memory for later use. Additionally, as the speed of the translating port door and the thickness of each wafer are both known, the length of time a properly positioned wafer will break the beam is known. As such, a double slotted wafer condition will be indicated where the beam is blocked for twice as long as expected. Additionally, a cross slotted condition will be indicated as a result of the beam being blocked for a period of time longer than for double slotted wafers. Upon detection of a double or cross slotted wafer by the wafer mapping system 38, processing of the wafers in that particular pod may be stopped and the improper position of the wafers corrected. Additionally, it is a feature of the present invention that wafer mapping occurs during the step of lowering the port door away from the process tool access port so that wafers may be passed between the pod shell and process tool through the access port. As such, the system of the present invention accomplishes wafer mapping without adding process steps or time to conventional wafer fabrication processes.

Various drive systems for rotating the fingers 46 and 54 from their retracted to their extended positions inside the pod will now be described with reference to FIGS. 1–3 and 8A–10. As shown in FIGS. 1 and 3, one system for actuating the fingers may comprise a single electrical driver 62 positioned below or to either side of the transmitter or receiver assemblies 40 and 42. According to this embodiment, the driver 62 may be a conventional motive component such as a multi-pole motor or solenoid which is actuated upon receipt of a signal indicating that the fingers are clear of the top of the pod shell. This condition may for example be indicated when the port door has been lowered past a particular elevation.

Torque from the driver 62 may be communicated to the respective fingers according to various known transmission schemes. As shown in FIGS. 1 and 3, the driver 62 in one embodiment includes a shaft 63 extending therefrom, which shaft drives a roller 64 via a belt 65. The roller 64 is mounted to a shaft 66 extending between the transmitter assembly 40 and the receiver assembly 42, which shaft 66 rotates with the roller 64. Rotation of the shaft 66 may in turn rotate the shafts 50 and 58 of the transmitter and receiver assemblies via a pair of bevel gears 67 and 68 provided between shafts 66 and 50, and shafts 66 and 58. Thus, rotation of the driver 62 in one direction pivots the fingers from their retracted to their extended positions, and rotation of the driver 62 in the opposite direction pivots the fingers from their extended to their retracted positions.

An alternative drive system is shown in FIG. 2. This embodiment includes a driver 62, shaft 63 and a belt 65 as described above. The belt drives a roller 150 coaxial with and mounted to the shaft 50 of the transmitter assembly 40. Thus, rotation of the driver 62 rotates the finger 46 of the transmitter assembly. A first eccentric rod 152 is affixed to a first side of shaft 50, and a second eccentric rod 154 is affixed to an opposite side of the shaft 58 (i.e., 180° away from the connection point of the first eccentric on the shaft 50). A connecting rod 156 is affixed between the ends of the first and second eccentric rods 152 and 154. With the above described mechanisms, rotation of the finger 46 in one direction drives rotation of the finger 54 in the opposite direction. It is understood that the driver 62 and belt 65 may alternatively be affixed to the receiver assembly, which in turn drives the transmitter assembly.

Figure 8A:
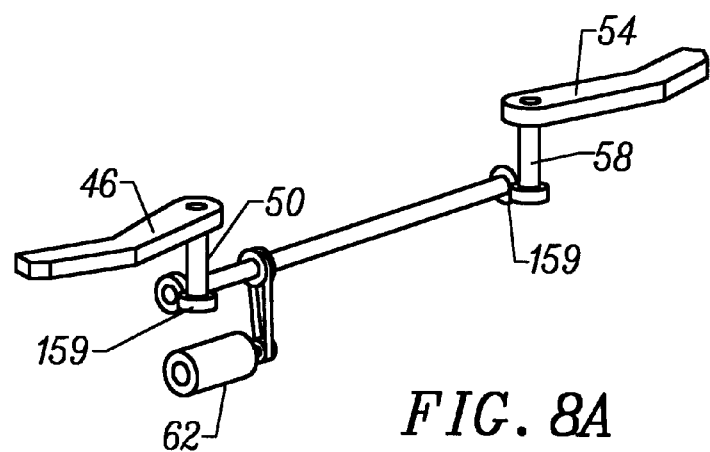
FIGS. 8A–C show perspective views of alternative transmission assemblies for transferring torque from the driver to the fingers.
Figure 8B:
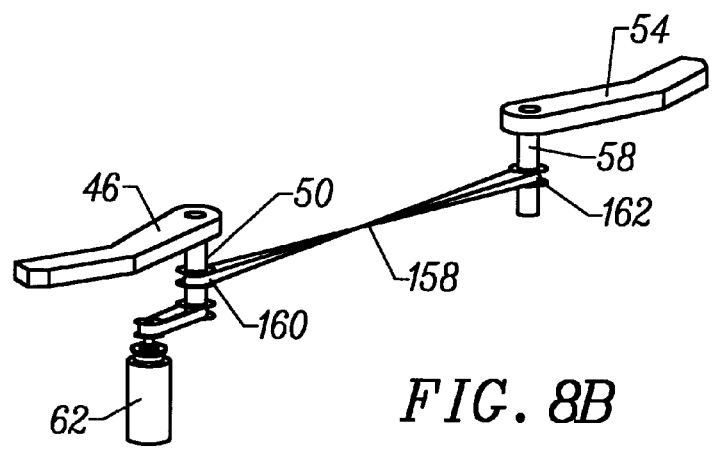
Figure 8C:
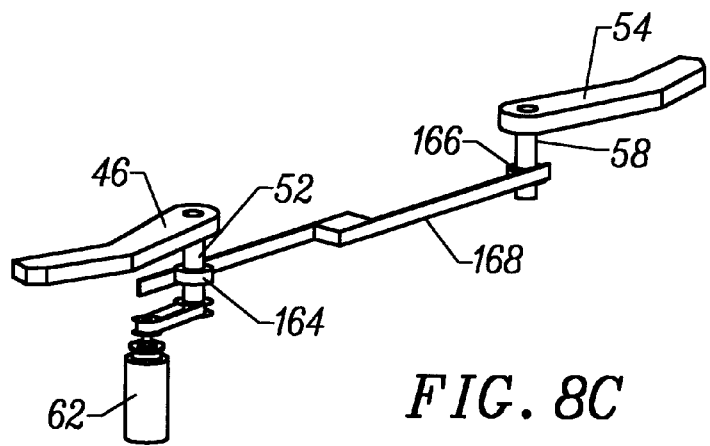

As would be appreciated by those of skill in the art, various other known transmission systems may be used for transferring the torque from the driver 62 to the respective fingers 46, 54. Three such additional embodiments are shown in FIGS. 8A through 8C. The embodiment in FIG. 8A is identical to that shown in FIGS. 1 and 3, with the modification that it includes a helical gear 159 instead of a bevel gear for transmitting the torque from the shaft 66 to shafts 50 and 58. The embodiment in FIG. 8B is similar to the embodiment described with respect to FIG. 2, with the modification that the eccentric and connecting rods are omitted, and a belt 158 is connected between the rollers 160 and 162 on the shafts of the respective fingers. The belt is twisted so that rotation of shaft 50 in one direction will drive rotation of shaft 58 in the opposite direction. FIG. 8C is also similar to the embodiment described with respect to FIG. 2, with the modification that the eccentric and connecting rods are omitted and replaced by a rack and pinion gear system. In particular, a pair of pinion gears 164 and 166 are mounted about shafts 50 and 58, respectively. An offset rack 168 has a first end engaged with pinion gear 164 and a second end engaged with pinion gear 166. The rack 168 has an offset 170 between its ends, and the gear teeth which engage the pinion gear 164 are on an opposite side of the rack than the gear teeth which engage the pinion gear 166. Therefore, rotation of shaft 50 in one direction will drive rotation of shaft 58 in the opposite direction. Other transmission systems are contemplated. In a further alternative embodiment of the present invention (not shown), each of the fingers 46 and 54 may include its own driver 62.

In each of the above-described embodiments, a constant biasing force is preferably exerted on each of the fingers that will maintain the fingers in their retracted position behind the port door in the absence of a driving force from the above-described drivers. This biasing force ensures that the fingers only extend from their retracted position when the port door is at the proper elevation. In one embodiment, a torsional spring (not shown) will be wrapped around the shafts 50 and 58 to provide the above-described biasing force. Other known biasing components are contemplated. Once the port door has lowered to an elevation where the emitted beam has passed below the bottom wafer slot in the cassette, and prior to contact of the fingers with the bottom of the pod shell, the drivers may rotate to pivot the fingers to their retracted positions. It is also contemplated that upon the port door reaching the bottom wafer slot, any force generated by the above-described drivers is removed, so that the biasing force of the torsional springs on the fingers rotate the fingers back to their retracted positions.

In an alternative embodiment, a transmitter/receiver pair may be provided on the load port to send a beam across the opening of the pod shell near the bottom of the pod shell. This transmitter/receiver pair indicates whether one of the fingers is in its extended position when it should in fact be retracted. If a finger is still extended, this transmitter/ receiver pair can generate a signal which is sent to the control circuit to stop the downward motion of the port door so that the problem can be fixed. It is understood that this beam may be generated and received by the above-described transmitter 44 and receiver 53, respectively, with the use of various beam splitters and mirrors. Alternatively, a separate transmitter/receiver pair (not shown) may be used. In a further alternative embodiment, the fingers may include a break-away joint so that in the event the fingers do contact the bottom of the pod shell, they can break away before damage is caused to the fingers and/or the pod shell.

Figure 9:
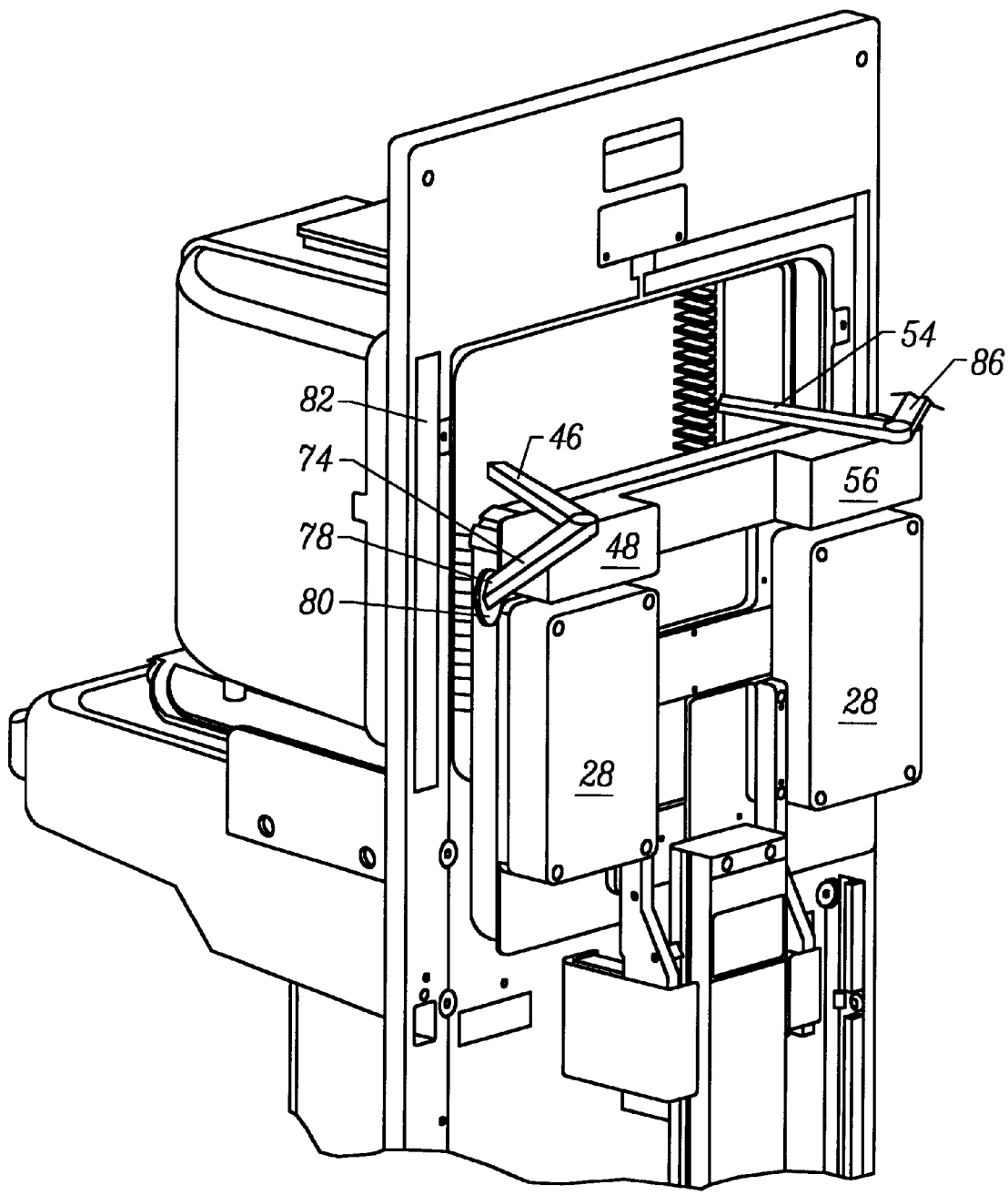
FIG. 9 is a rear perspective view of a wafer mapping system according to the present invention showing a further alternative drive system.
Figure 10:
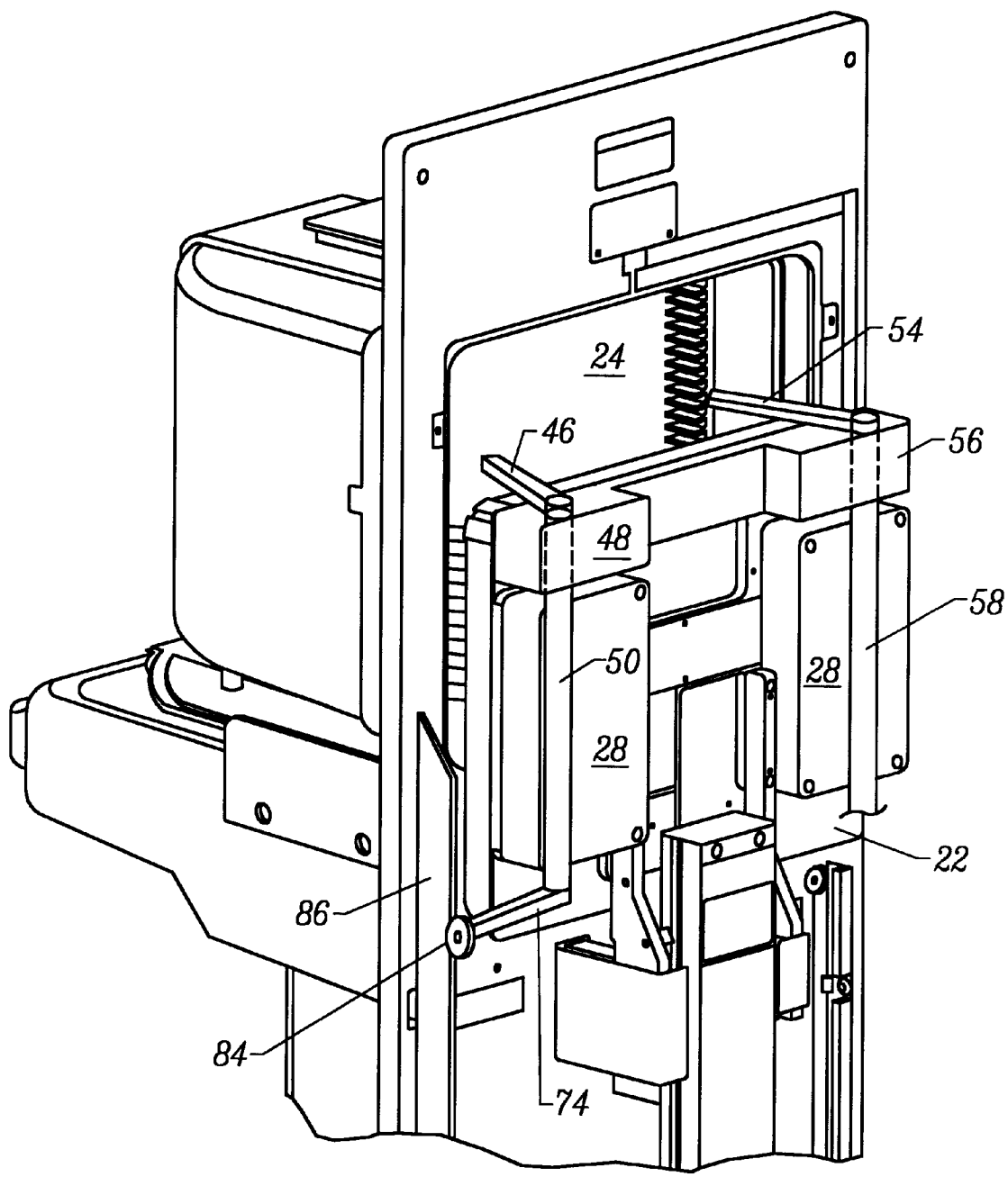
FIG. 10 is a rear perspective view of a wafer mapping system according to the present invention showing another alternative drive system.
Figure 11:
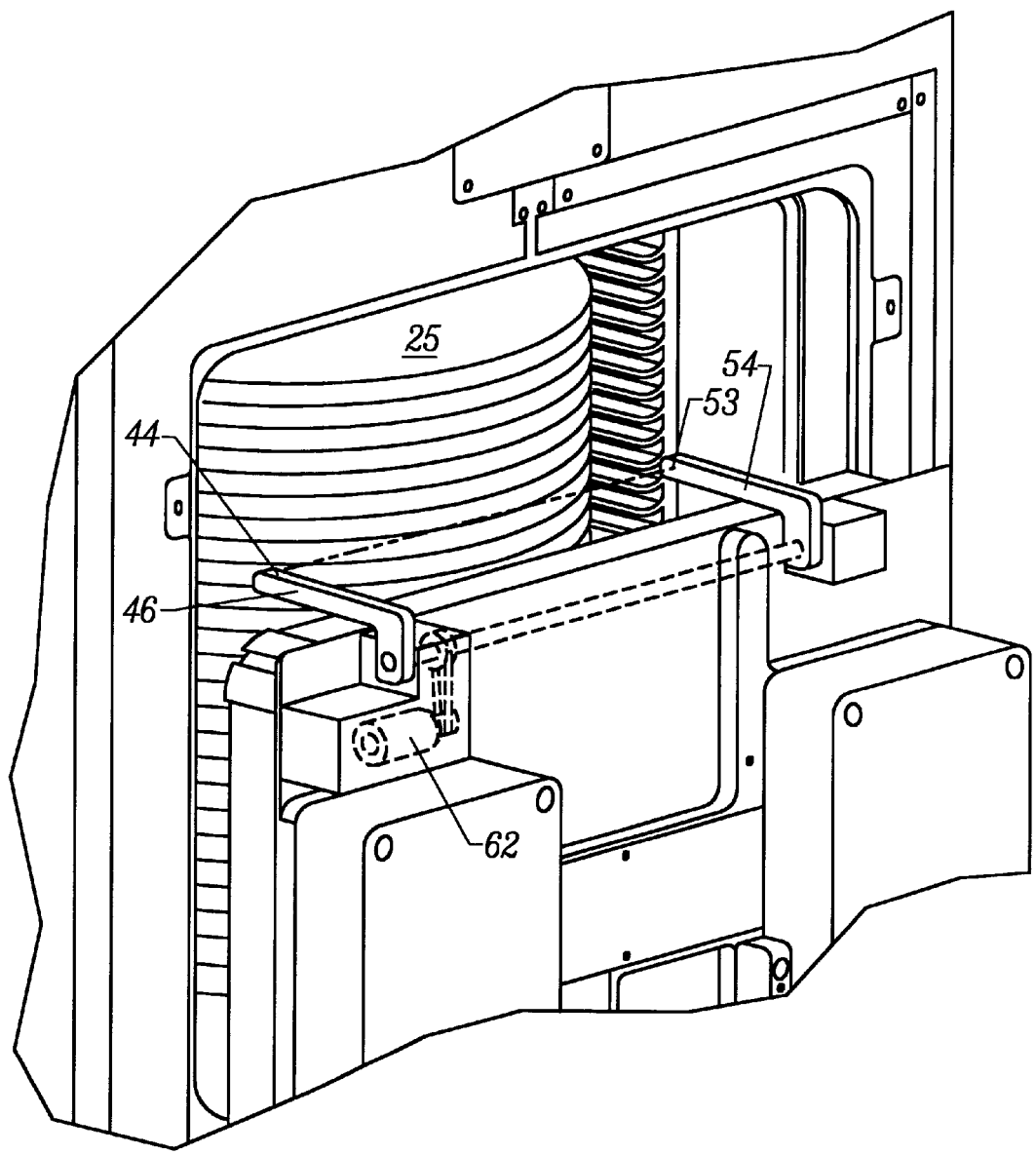
FIG. 11 illustrates a side view of a wafer mapping system according to the present invention including fingers rotating about an alternative axis to that shown in FIG. 3.

In addition to an electrical driving system, the fingers may be rotated between their retracted and extended positions by a passive driving system as shown in FIGS. 9 and 10. As shown for example in FIG. 9, the electrical drivers may be omitted, and instead the respective fingers 46 and 54 may each include extensions 74 and 76, respectively. The structure and operation of extensions 74 and 76 are identical to each other, and only one extension 74 and accompanying structures are fully shown in FIG. 9 and described hereafter. Each of the extensions 74, 76 includes a magnet 80 affixed to an end portion 78 thereof. When the fingers are in their retracted positions, the magnets 80 are positioned over the interior surface of the port plate at either side of the access port 24. The embodiment of FIG. 9 additionally includes a biasing force, such as torsional spring (not shown), to bias the fingers into their retracted positions and the magnets 80 into a position adjacent the interior surface of the port plate.

In the embodiment of FIG. 9, vertically oriented magnetic strips 82 are further provided in or on the interior surface of the port plate at either side of the access port 24. As the port door moves downward, just after the fingers 46 and 54 are at an elevation clear of the pod shell top, the magnets 80 on the end portions 78 will engage the respective magnetic strips 82. The poles of the magnets 80 and magnetic strips 82 are aligned so that upon encountering the magnetic strips, a force is generated which opposes and overcomes the biasing force of the torsional spring. At this point, the magnets 80 spring away from the magnetic strips on the port door, thereby rotating the fingers 46 and 54 to their extended positions within the pod shell 32 as shown in FIG. 9. Once the port door has lowered to a point where the fingers have cleared the final wafer slot within the pod shell 32, the magnets 80 travel beyond the end of magnetic strips 82 so that the biasing force will once again rotate the fingers to their retracted positions so as to avoid contact with the bottom of the pod shell.

An alternative embodiment of a passive drive system is shown in FIG. 10. The embodiment of FIG. 10 includes the extensions 74 and 76 having end portions 78 as described above with respect to FIG. 9. As above, the structure and operation of the extensions 74 and 76 according to this embodiment are identical to each other, and only the extension 74 and accompanying structures are fully shown in FIG. 10 and described hereinafter. In the embodiment of FIG. 10, the shafts 50 and 58 on which the fingers 46 and 54 are respectively mounted are elongated, and rotationally supported by bearings (not shown) within the respective transmitter and receiver assembly housings 48 and 56. The above-described extensions 74 and 76 are mounted at the ends of each of the respective shafts 50 and 58, and annular followers 84 are in turn rotationally mounted to the ends of each of the extensions 74 and 76. Additionally, instead of magnetic strips 82, a raised track 86 is vertically provided on the interior surface of the port plate on either side of the access port 24. Although not shown, the uppermost portion of track 86 is located preferably below the lowermost portion of the access port 24. However, it is understood that the elevation of the track 86 relative to the access port 24, and accordingly the lengths of shafts 50 and 58, may vary in alternative embodiments. The above-described torsional springs are preferably further provided to bias the fingers in their retracted position and the followers 84 against the interior of the port door.

According to the embodiment of FIG. 10, as the port door moves downward, the followers 84 engage the respective raised tracks 86 to rotate the fingers 46, 54 outward to their extended positions within the pod shells. The followers 84 preferably include a concave outer circumference to improve the ability of the followers 84 to follow the raised tracks 86. Followers 84 are preferably formed of rubber or other low particulate generating materials. At the point where the fingers have passed the bottommost wafer slot, the followers 84 reach the bottom of the raised tracks 86 so that the biasing force once again returns the fingers 46, 54 to their retracted position behind the port door.

Up to this point, the fingers 46, 54 have rotated about a vertical axis from their retracted position behind the port door to their extended position within the pod shell. In an alternative embodiment of the present invention shown in FIG. 11, in their retracted position, the fingers 46, 54 are mounted to the rear surface of port door 22 and extend upward above the top edge of the port door (not shown). Upon lowering of the port door, the fingers 46 and 54 may be rotated about a horizontal axis downward to a position inside the pod shell 32. In order that the fingers be positioned above the uppermost wafer slot in this embodiment, it is contemplated that the port door either slow down, stop or raise upward after the fingers have cleared the top of the pod shell so that they may be properly positioned to map information from the uppermost wafer slot. It is contemplated that the fingers rotate between their retracted and extended position in a plane perpendicular to the port door or at some other angle less than or greater than 90° with respect to the port door in their fully extended positions.

In a further embodiment of the present invention (not shown) it is understood that, instead of rotating, the fingers may extend straight out from the port door. In this embodiment, the fingers could comprise a telescopic body that allows the fingers to extend and retract upon actuation by a known driving system. The driving system may comprise a solenoid so that upon receipt of an electric current, the fingers extend, and upon removal of the current, the fingers retract. A biasing force, such as a spring under tension may be provided to bias the fingers into their retracted position.

Up to this point, mapping of the wafers has been accomplished completely independent of the position of the pod shell on the load port. That is, the wafer mapping system 38 is in effect inserted into the pod shell 32 without engaging the pod shell or relying on a position of the pod shell on the load port. The position of the wafers as determined by the wafer mapping system 38 is solely dependent on the position of the port door as it moves downward away from the access port.

Figure 12:
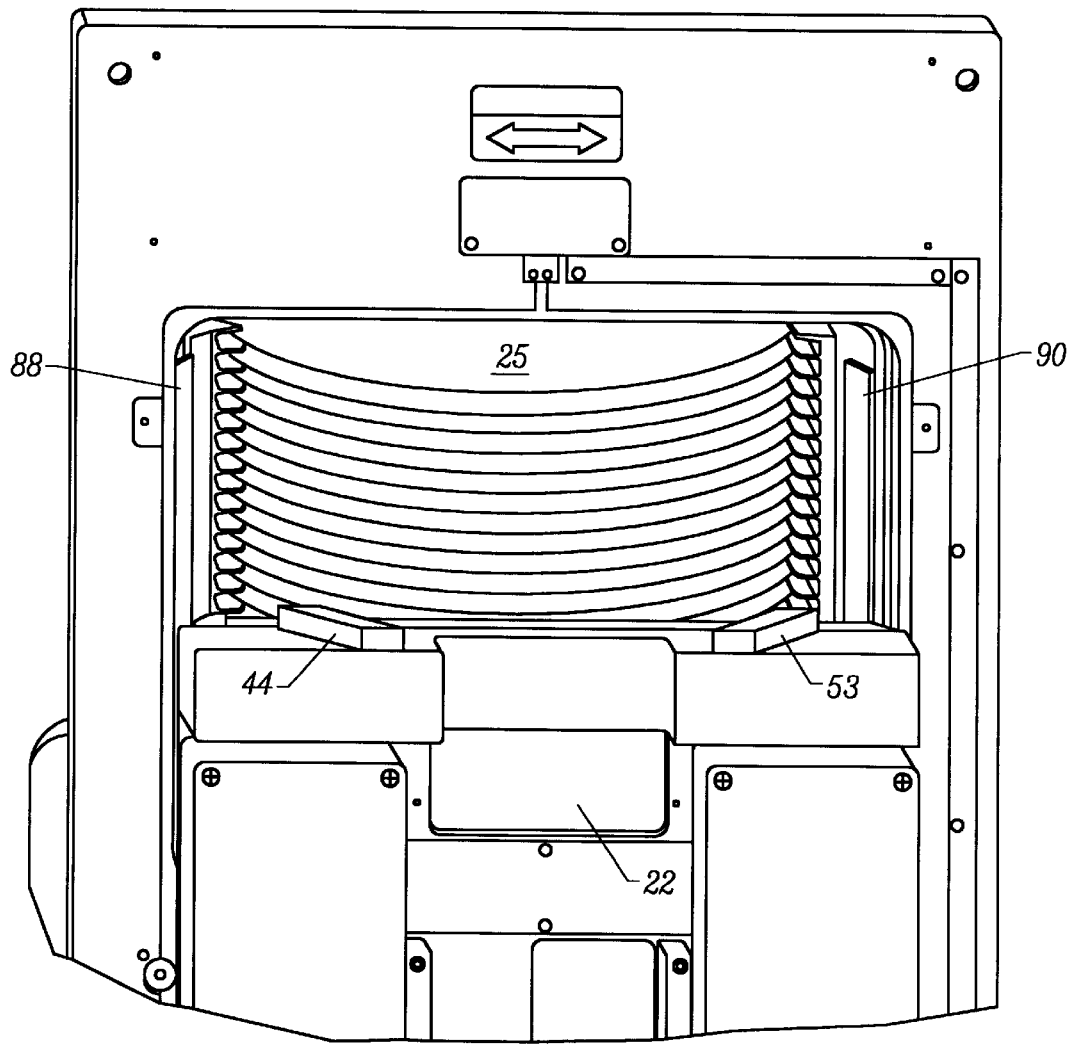
FIG. 12 is a rear perspective view showing a wafer mapping system according to an alternative embodiment of the present invention not including moving fingers.

In a further alternative embodiment shown in FIG. 12, the moving fingers 46 and 54 are omitted. In this embodiment, a transmitter 44 as described above is mounted on a rear of the port door for transmitting a beam over the door and into the pod, and a receiver 53 as described above is mounted on a rear of the port door for receiving the beam back from the pod shell over the top of the port door. According to this embodiment, a pair of vertically oriented reflective strips are provided in the pod shell 32, either mounted to the wafer support columns which include the individual wafer slots, or mounted to the pod shell itself. The reflective strips 88, 90 are angled inward toward each other, at an angle of for example 45°, so that the reflective strip 88 receives the beam from the transmitter 44, and redirects it across the pod shell interior to the second reflective strip 90. The reflective strip 90 in turn redirects the beam out of the pod shell back to the receiver 53. The precise location of the beam over the wafers is determined by the positions of the transmitter and receiver on the port door and the positions of the reflective strips within the pod shell. As in the above-described embodiments, the wafer mapping system according to this embodiment is capable of detecting and mapping the elevation of each of the wafers within the pod, as well as identifying any wafers that are cross slotted or double slotted.

Figure 13:
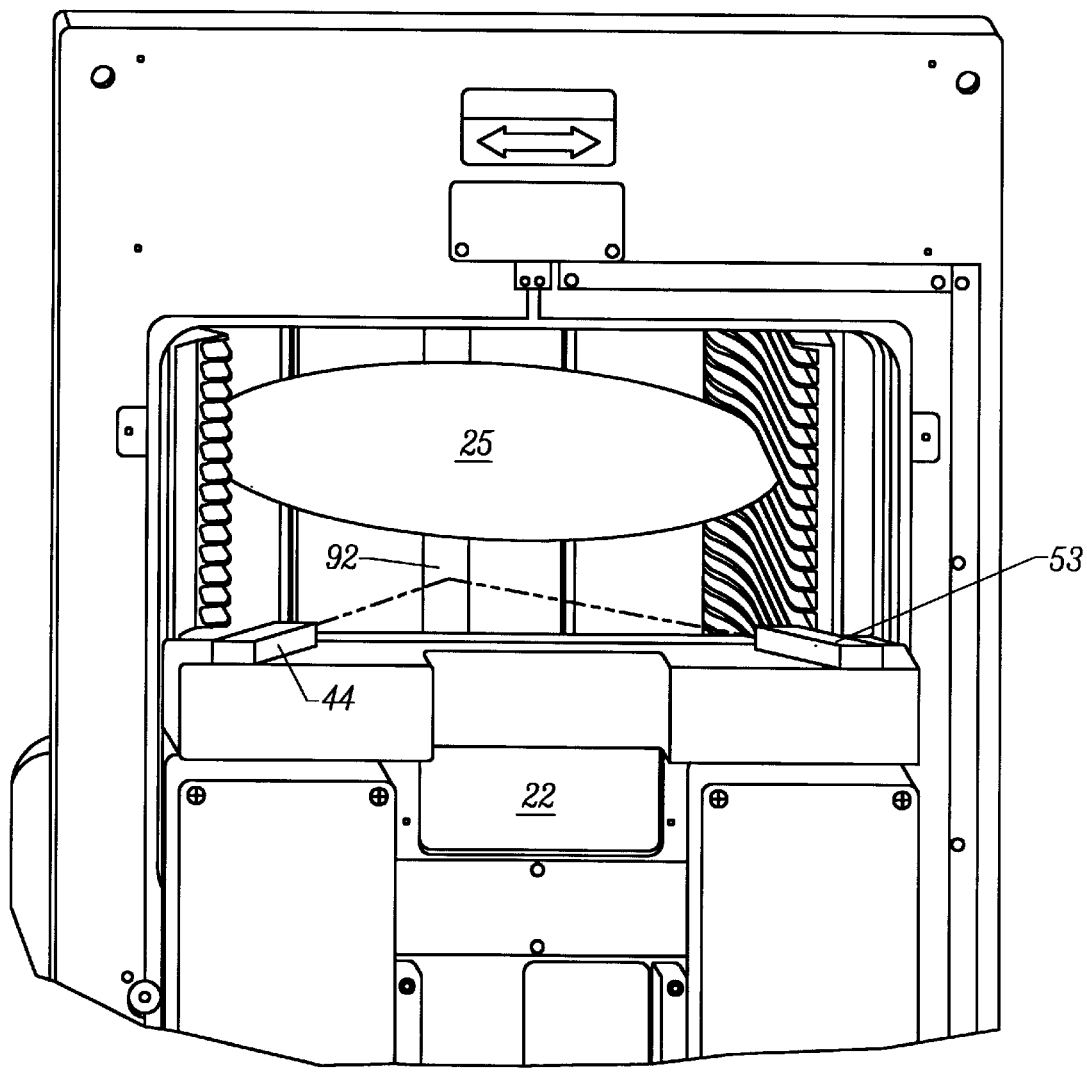
FIG. 13 is a rear perspective view illustrating a wafer mapping system according to an alternative embodiment to that shown in FIG. 12.

FIG. 13 shows an alternative embodiment to that shown in FIG. 12. In the embodiment of FIG. 13, the transmitter 44 and receiver 53 are angled inward toward a single reflective strip 92 at a rear of the pod. In this embodiment, the transmitter 44 directs the beam over the top of the port door and into the pod toward the reflective strip 92. The strip in turn reflects the beam back to the receiver 53. It is understood that the locations and the angles of the transmitter and receiver, and the location and angle of the reflective strip 92, may vary with the provision the beam be transmitted onto the reflective strip 92 and be received back in the receiver. The wafer mapping system according to the embodiment of FIG. 13 may be used to sense the presence of a wafer in a particular wafer slot, as well as a double slotted wafer as described above. However, as the beam in this embodiment no longer travels across the pod shell between wafer slots, a slightly different algorithm must be employed by the control system to sense the presence of cross slotted wafers. The algorithm according to this embodiment may for example make use of the fact that the port door moves downward at a constant rate. Therefore, the wafer mapping system may expect to encounter a wafer, if at all, at preset, constant intervals given by the pitch of the wafer slots. In the event a beam is broken at a time other than at the preset interval, this is an indication of a cross slotted wafer. As described above, if a cross or double slotted wafer is detected, the process may be stopped and the position of the double or cross slotted wafer corrected.

Figure 14:
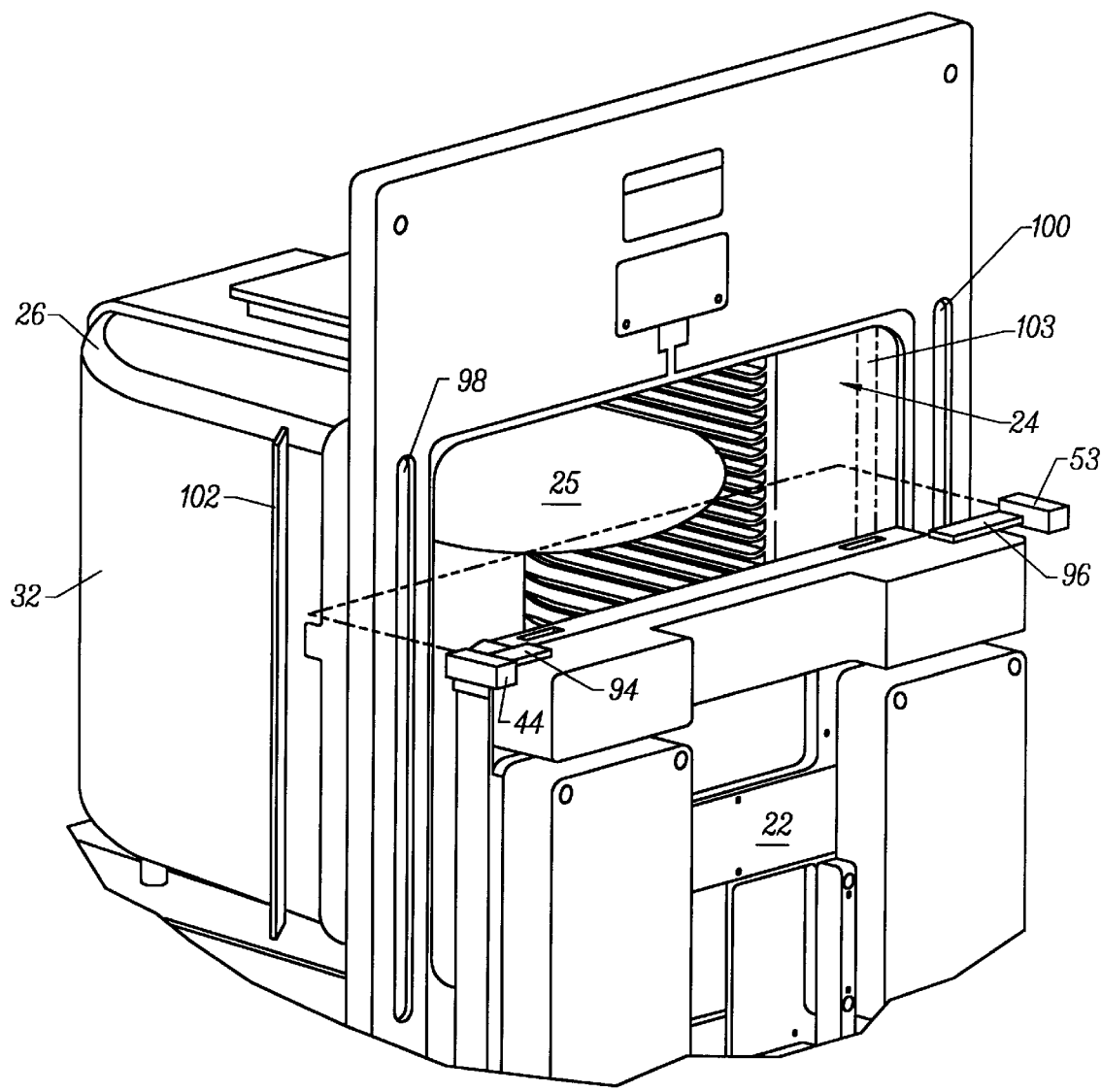
FIG. 14 shows a rear perspective view of the wafer mapping system according to an alternative embodiment of the present invention including a transmitter and receiver mounted on sides of the port door.

A further alternative embodiment of the present invention is shown in FIG. 14. This embodiment is similar to the embodiment of FIG. 12 with the modification that the reflective strips are not mounted within the pod shell, but are instead mounted vertically on and in front off the port plate on either side of the port door. It is also understood that the reflective strips may be mounted on the horizontal surface of the load port supporting the pod 26 to extend vertically upward therefrom. In this embodiment, instead of having the transmitter and receiver mounted at the top of the port door, the transmitter and receiver are mounted on ears 94 and 96 extending outward from opposed sides of the port door. In this embodiment, transparent windows 98 and 100 are provided vertically in the port plate at either side of the access port 24. According to the embodiment of FIG. 14, as the port door moves downward, the transmitter 44 directs the beam through the window 98 in the port plate and onto reflective strip 102 on the port plate. The reflective strip 102 is angled inward to redirect the beam through a first side of the pod shell, across the interior of the pod shell, and out a second side of the pod shell. At that point, the beam impacts the second reflective strip 103 which is angled to redirect the beam through the transparent window 100 back to receiver 53. The sides of the pod shell are transparent so as allow the beam to pass therethrough. As in the embodiment of for example FIG. 12, the wafer mapping system according to FIG. 14 is capable of mapping the presence and position of each of the wafers within the pod 26.

Typically, any structures located on a load port must be positioned so as to leave a large clearance between such structures and a pod or cassette located either manually or automatedly on the load port. However, in front opening load ports as utilized with the present invention, after a pod is manually or automatedly loaded onto a horizontal support plate of the load port, the pod is then automatically advanced up to the port door, between the reflective strips 102 and 103. As the pod is advanced by automated mechanisms, a tight clearance may be provided between the reflective strips 102, 103 and the pod. This provides an advantage of reducing the possibility of stray reflections of the beam.

In the embodiment of FIG. 14, the wafer mapping system may also be used to detect whether a pod or cassette is located on the load port. For example, as the pod moves downward, the top of the pod will break the beam at a first elevation while the top of a bare cassette will break the beam at a second elevation. The central processor can then identify whether a pod or a cassette is on the load port based on the elevation of the port door upon the beam initially being broken.

It can happen during the loading of a pod onto a load port of a process tool that a fab technician may inadvertently have his or her hand in front of the port door as the pod door is advanced into contact therewith. In addition to the minor injury to the fab technician as a result of his or her hand getting pinched between the pod and port doors, such an occurrence may interfere with the proper mating of the pod and port doors. It is also possible that other objects may inadvertently be placed in front of the port door as the pod door is about to be coupled therewith.

In order to detect a technician's hand or any other object over the port door as the pod door advances, the wafer mapping system according to an alternative embodiment of the present invention may cause the beam to encircle the port door before the port and pod doors are joined to form a "sensing window" around the port door. Such an embodiment is shown in the front and side views of FIGS. 14A and 14B, respectively. As shown in those figures, when the port door is sealed within the access port prior to a pod door mating with the port door, transmitter 44 transmits a beam through the window 98 as described above which beam contacts a first splitter/redirector device 140. The splitter/redirector device 140 is located above the reflective strip 102. Upon contact with the splitter/redirector device 140, the beam is split and redirected so that the first portion of the beam is redirected across the top of the port door 22 and the second portion of the beam is redirected down along the side of the port door 22. As would be appreciated by those of skill in the art, the splitter/redirector device 140 may be comprised of various beam splitting and reflective components for dividing and redirecting the beam as described above.

The portion of the beam projected downward along the side of the port door is received within a receiver 142 mounted at a height below the port door. The receiver 142 may be mounted on the exterior of the port plate surrounding the port door, or may be mounted within the interior of the process tool, in which case a mirror (not shown) would be provided on the exterior of the port plate to redirect the beam to the receiver 142. The portion of the beam traveling across the top of the port door contacts a second beam splitter/redirector device 144 which redirects a portion of the beam back through window 100 to the receiver 53, and also redirects a portion of the beam downward along the second side of port door 22. As with the first splitter/redirector device 140, splitter/redirector device 144 may be comprised of various known components for splitting and redirecting the beam. In an alternative embodiment, the beam may simply be redirected downward and not split. The beam (if not split) or the portion of the beam (if split) reflected down along the second side of the port door is received in a receiver 146, or alternatively contacts a mirror which in turn redirects the beam through the window 100 and onto the receiver 146 mounted within the interior of the process tool, as described above with respect to receiver 142.

Figure 14A:
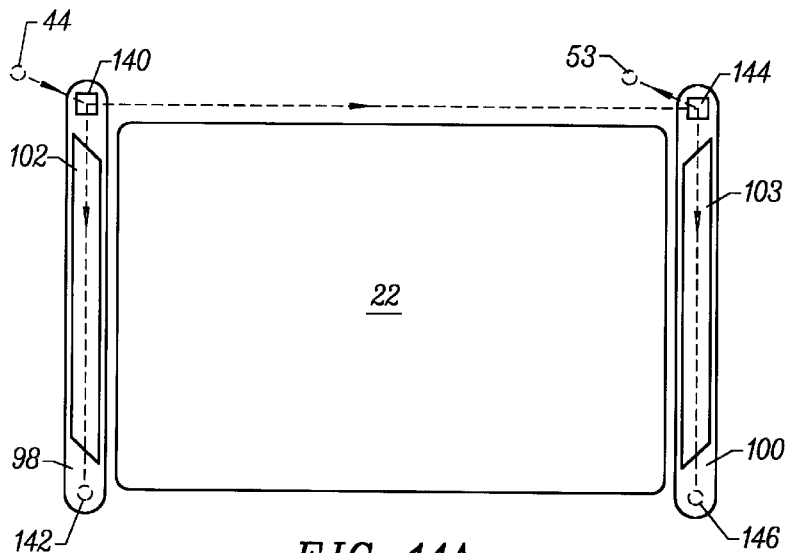
FIGS. 14A and C are front views of the wafer mapping system shown in FIG. 14, additionally showing mechanisms for sensing whether a fab technician's hand or other object is in the way of the pod door mating with the port door.
Figure 14B:
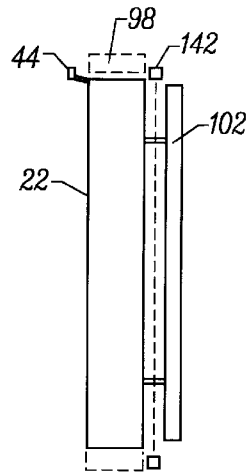
FIGS. 14B and 14D are side views of the wafer mapping system shown in FIG. 14, additionally showing mechanisms for sensing whether a fab technician's hand or other object is in the way of the pod door mating with the port door.

According to the embodiments of FIGS. 14A and 14B, the sensing window lies in a vertical plane substantially parallel to the port door. The distance of the sensing window from the port door may vary in alternative embodiments. In the event an operator's hand or other foreign object lies in front of the port door as a pod approaches, some portion of the beam will be broken and as such not received in one or more of the respective receiver 53, 142, and 146. Upon detection of a broken beam, an alarm signal may alert the technician as to an object being located within the sensor window and/or the advancement of the pod to the port door may be halted.

Figure 14C:
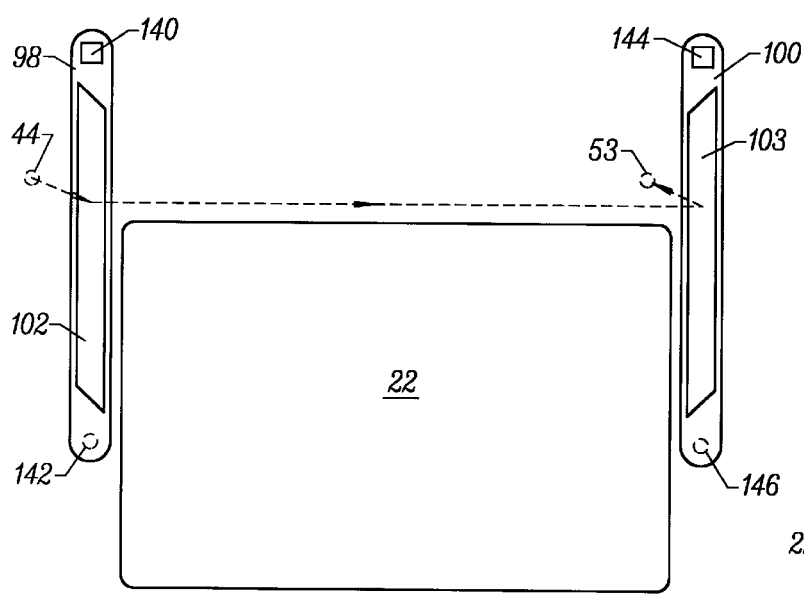
Figure 14D:
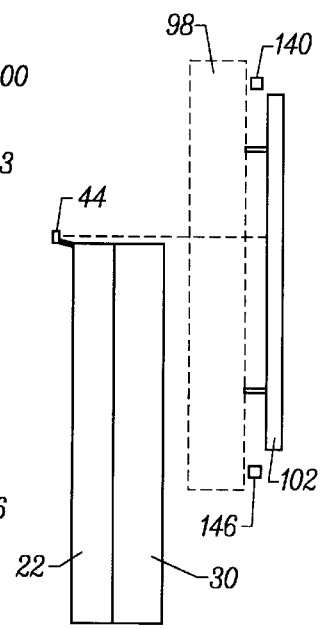

Referring to FIGS. 14C and 14D, after the port door 22 and pod door 30 are joined and have moved into the interior of the process tool, they begin to move downward as described above. Once the transmitter 44 lowers below the horizontal plane of the splitter/redirector device 140, the splitting and redirecting of the beam as shown in FIGS. 14A and 14B ceases, and the sensor window disappears. The port and pod doors then continue to lower until the transmitter 44 reaches the horizontal plane of the top of the reflective strips 102 and 103, at which time the beam from transmitter 44 is redirected by reflective strip 102 through the pod (not shown in FIGS. 14C and 14D), against reflective strip 103 and then back to receiver 53 as described above with respect to FIG. 14.

Up to this point, the various embodiments of the wafer mapping system have all been break-the-beam systems. That is, the system detects the presence of a wafer at a particular elevation as a result of the beam being broken from the receiver. A further alternative embodiment of the present invention is shown in FIGS. 15–20, which in general relate to a retroreflective wafer mapping system 104. The retroreflective mapping system 104 includes a pair of transmitter/receiver units 106, which units each include a transmitter and receiver as described above. According to the embodiments of FIGS. 15–20, the transmitter of the unit 106 transmits a beam into the interior of the pod shell 32 in a horizontal plane as the port door moves downward. Upon encountering a wafer in a particular wafer slot, the beam is reflected back off the wafer edge to the receiver of the unit 106. Upon receiving the beam off of the wafer, the receiver sends a signal to the controller to store the particular location of that wafer. According to this embodiment, the beam may be transmitted at various wavelengths, and may comprise coherent light or otherwise. In a further alternative embodiment, the beam may comprise soundwaves instead of lightwaves.

Wafers are conventionally formed with a notch in their outer circumference. A rotational position of the wafers in the pod may vary and therefore the angular position of the notch on the wafers in the pod is not clearly known or uniform. Therefore, two independent transmitter/receiver units 106 are provided. Both pairs are mounted at the top of the port door near to the sides of the top edge. The transmitter and receiver of each unit 106 are positioned so that upon encountering a particular wafer, the beams of each transmitter will be reflected back to their respective receivers. In the event one of the transmitter/receiver pairs directs a beam toward a wafer and the beam lands within the notch of the wafer (so that it will not be reflected back to the receiver of that unit), the other of the two transmitter/receiver units 106 will still register the presence of the wafer in that particular wafer slot.

In addition to reflecting back off the wafer edge, it has been determined that a portion of the beam from one unit 106 goes past the wafer edge, reflects off the rear of the pod shell, and is received in the receiver of the other unit 106. In order to eliminate this cross talk, the transmitters of the respective units 106 transmit beams at different frequencies, and the receivers are tuned to detect only the frequency of its corresponding transmitter. For example, one of the transmitter/receiver units 106 may be tuned to a frequency of 670 nanometers (nm) plus or minus 5 nm, and the other of the transmitter/receiver units 106 may be tuned to a frequency of 650 nm plus or minus 5 nm. Additionally, the beams from the transmitters may be modulated and the receivers may be configured to register only the modulated signal of its corresponding transmitter. This further prevents cross talk between the respective units 106 and prevents a false reading in the receivers from ambient light.

Figure 16A:
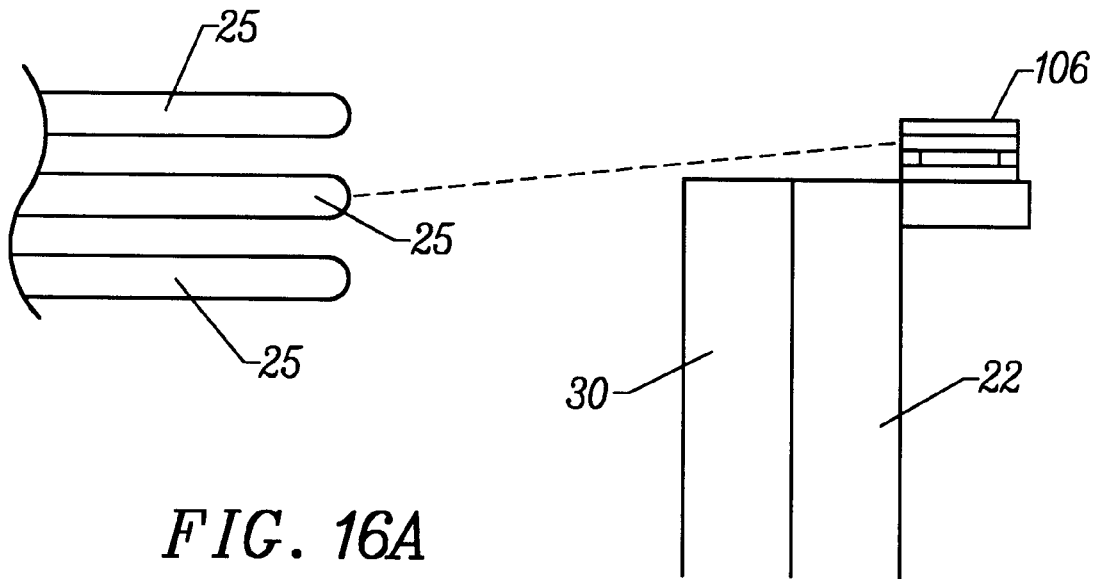
FIG. 16A is a schematic representation of a transmitter/receiver unit with a component of the transmitted beam being reflected off an upper edge of a wafer.
Figure 16B:
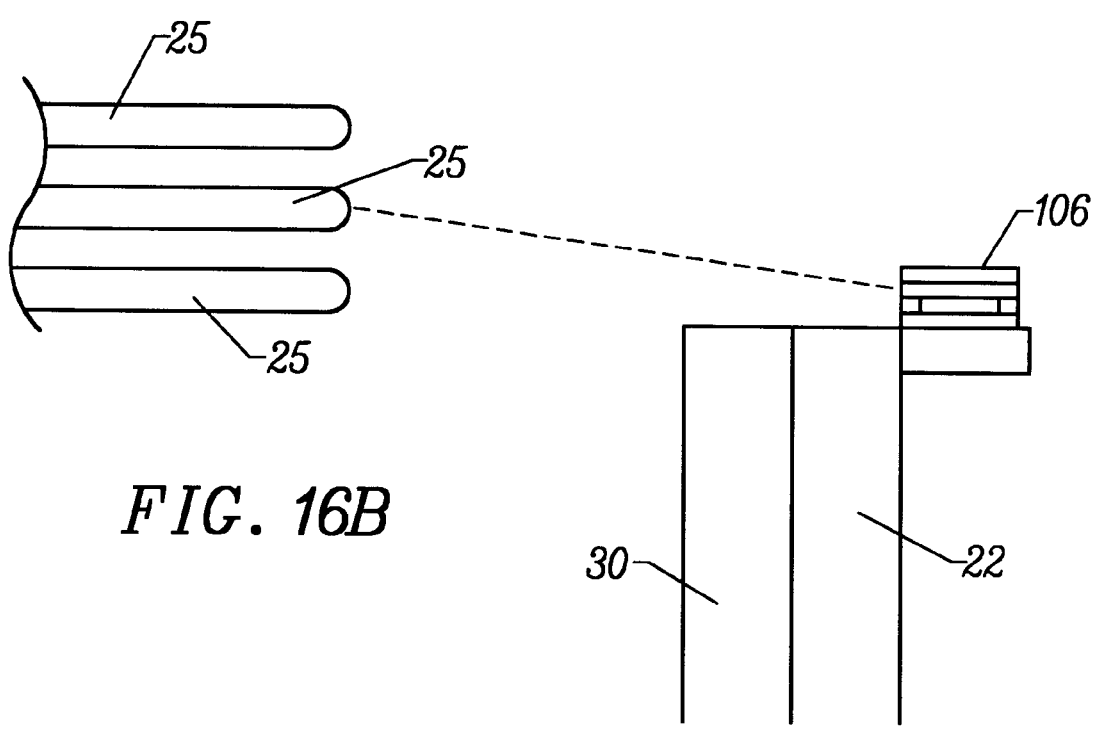
FIG. 16B is a schematic representation of a transmitter/receiver unit with a component of the beam transmitted being reflected off a bottom edge of the wafer.

Another potential problem with reflecting off of a wafer edge is that the wafer edges are not purely perpendicular to the planar surface of the wafer or the plane of the beam. The edges are somewhat rounded. Therefore, as shown in FIG. 16A, where the sensor system is above a particular wafer, there is a potential for a downwardly traveling component of the beam to be reflected upward off the wafer edge and back to the receiver. This situation results in an "early" reflected signal, in that the signal would indicate the presence of a wafer before the wafer mapping system had actually reached the plane of the detected wafer. Similarly, as shown in FIG. 16B, after the sensor system has passed below a particular wafer, there is a potential for an upwardly traveling component of the beam to be reflected downward off the wafer edge and back to the receiver. This situation results in a "late" reflected signal, in that the receiver would still indicate the presence of a wafer after the wafer mapping system had passed through the plane of the detected wafer.

In order to avoid this situation, the receiver in each of the transmitter/receiver units 106 is recessed behind an aperture 108 (FIG. 17), which aperture prevents components of the beam from reaching the receiver from obliquely incident angles. Only those components of the beam which are reflected back substantially in the plane of the wafer are received. Thus, the beam will be reflected back into the receiver only when the wafer mapping system resides substantially in the plane of the wafer. Additionally, preventing obliquely incident components of the beam from contacting the receiver allows the receiver to be calibrated to a high gain setting. This is advantageous when working with nitrided wafers which have poor reflectivity.

Figure 15:
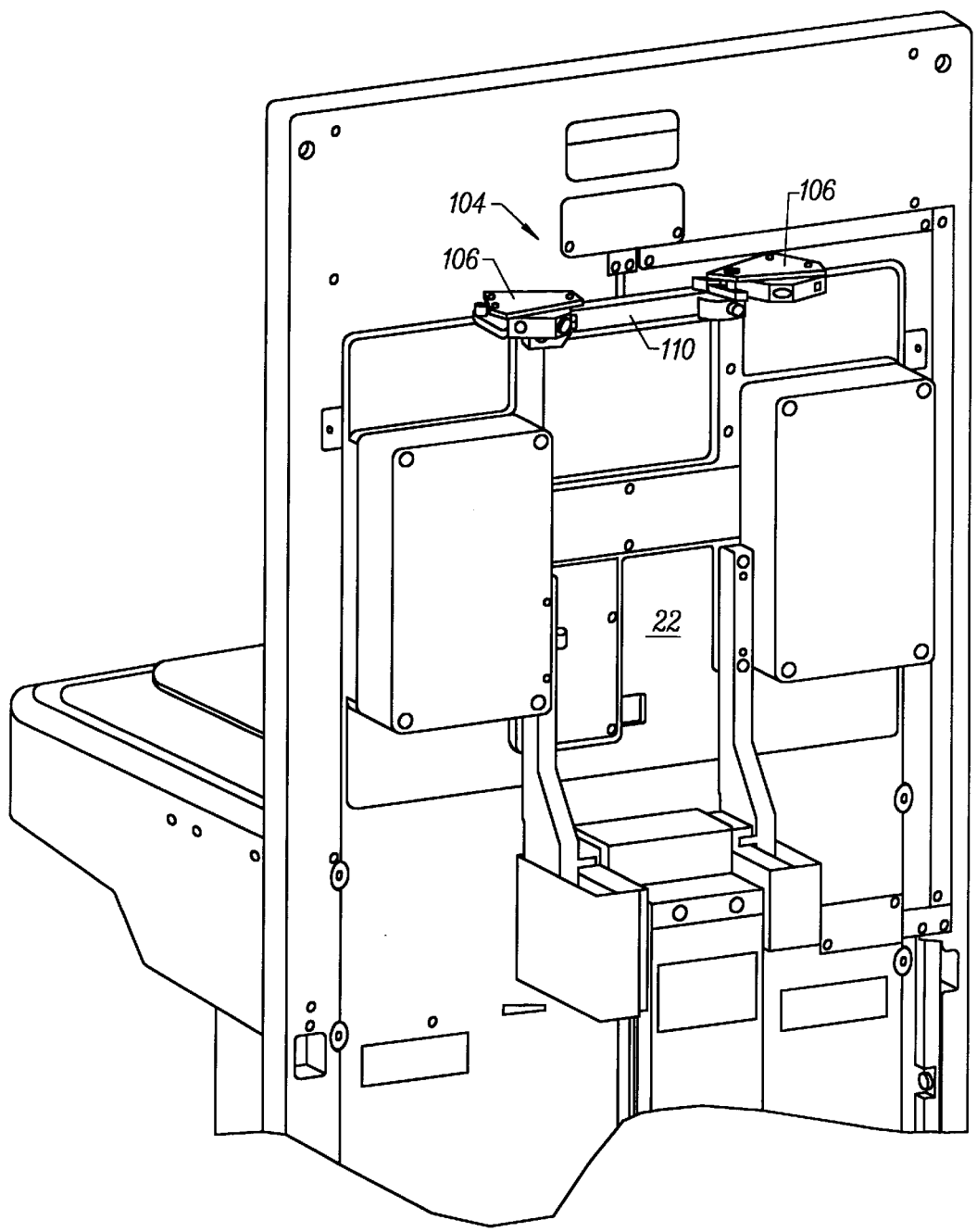
FIG. 15 is a rear perspective view of a wafer mapping system including retroreflective transmitter/receiver units according to an alternative embodiment of the present invention.
Figure 17:
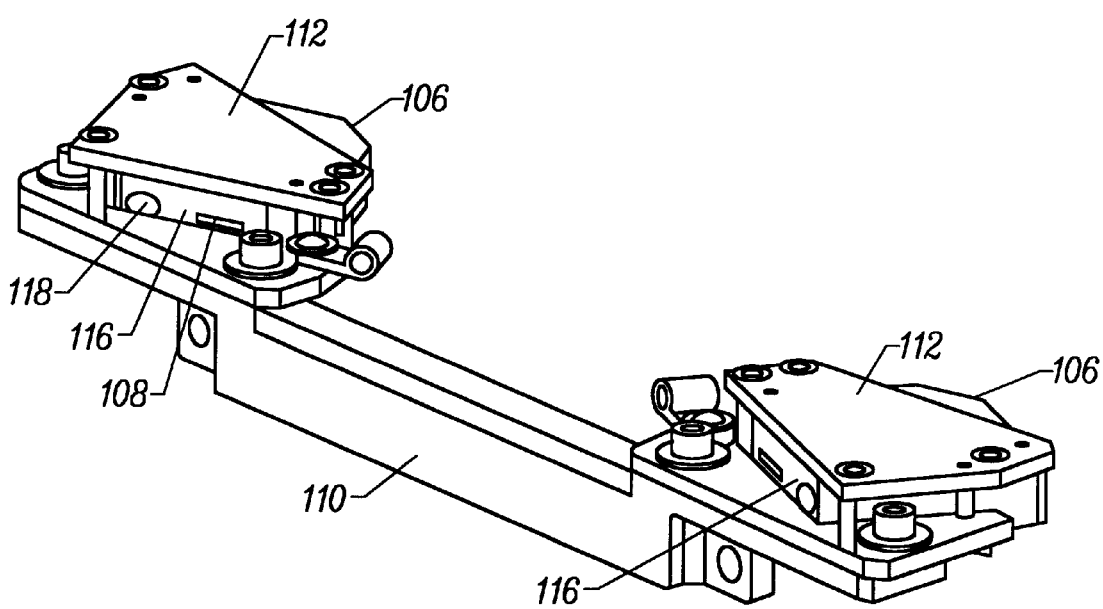
FIG. 17 is an enlarged front perspective view of the retroreflective sensor shown in FIG. 15.
Figure 18:
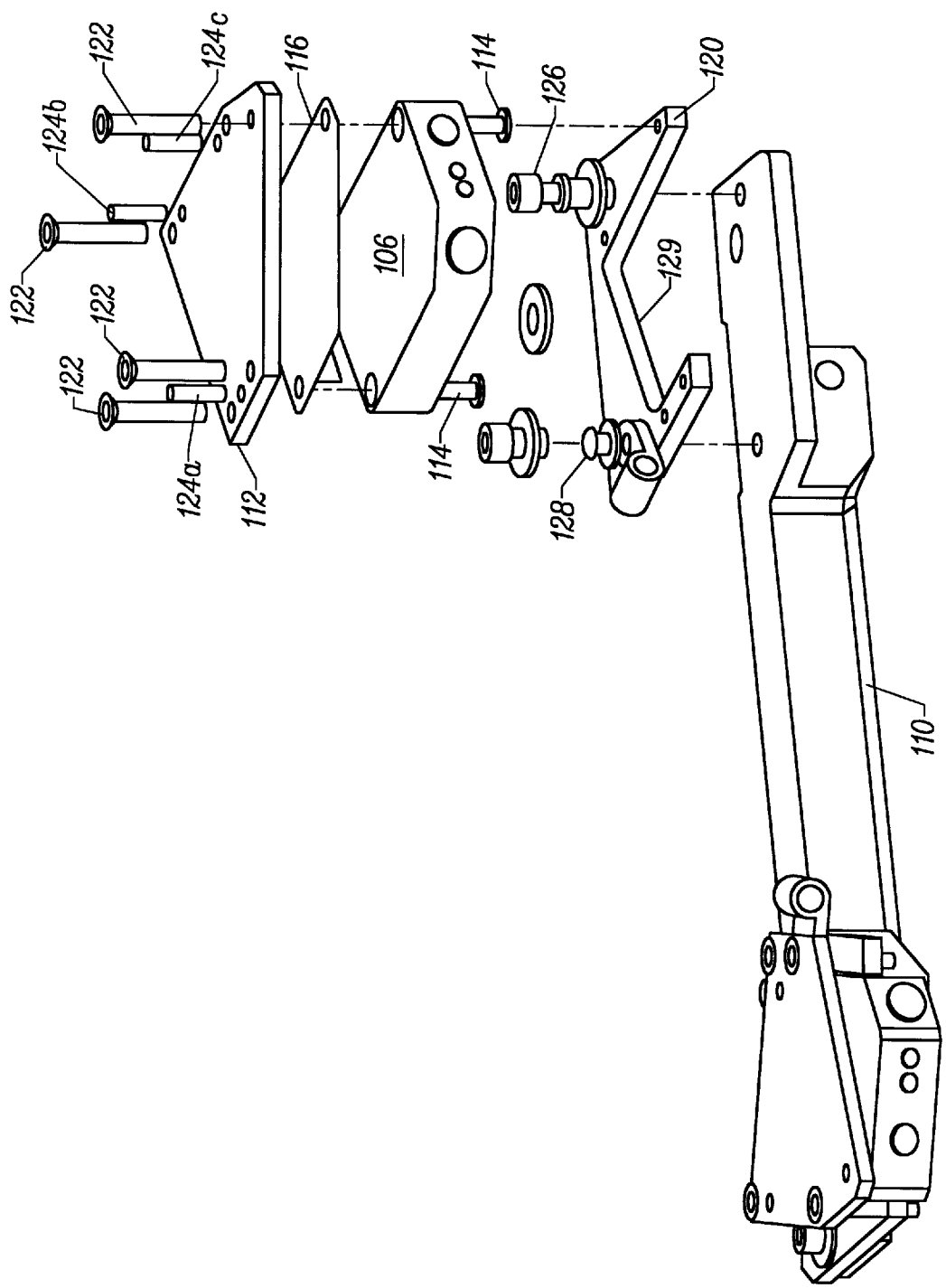
FIG. 18 is an exploded rear perspective view of the retroreflective sensor shown in FIG. 15.

Referring now to FIGS. 15 and 17–18, each of the transmitter/receiver units 106 is mounted to a support bracket 110. Support bracket 110 is in turn centrally mounted at the top of the port door. In a preferred embodiment, the respective transmitter/receiver units 106 may be spaced apart approximately three inches on the support bracket, although this dimension may vary in alternative embodiments. The respective transmitter/receiver units 106 are structurally and operationally identical to each other (with the exception of the frequency of the emitted beam as discussed above), so for convenience, only one of the units 106 is described hereinafter. However, it is understood that the following description applies equally to both transmitter/receiver units 106.

As seen most clearly in the rear perspective view of FIG. 18, the transmitter/receiver unit 106 is affixed to a top support plate 112 by screws 114. An aperture plate 116 may be interposed between the transmitter/receiver unit 106 and the support plate 112. Although not seen in FIG. 18, FIG. 17 shows that the aperture plate 116 covers the transmitter and receiver in each of the units 106, but includes a hole 118 through which the transmitter emits the beam, as well as the above-described aperture 108 behind which is mounted the receiver.

The support plate 112 is in turn mounted to a rotational adjustment plate 120 (described in greater detail below) by a plurality of locking screws 122. Three leveling screws 124a, 124b and 124c are provided through threaded holes in support plate 112 and into contact with the rotational adjustment plate 120. The leveling screws 124a–c determine the spacing between the transmitter/receiver unit 106 and the rotational adjustment plate 120. By adjusting the position of each of the leveling screws together, the vertical height of the transmitter/receiver unit 106 above the rotational adjustment plate and the port door may be adjusted. This is significant because the plane of the beam must be provided at a predetermined and set height above the port door in order for the controller to determine the precise height of a wafer registered by the wafer mapping system. Rotation of the three leveling screws 124a–c together allows the height of the beam to be adjusted to this predetermined and set height above the port door.

Additionally, by adjusting the position of one of the screws, the transmitter/receiver unit 106 may be tilted with respect to the rotational adjustment plate and the port door. Thus, for example, by adjusting the position of the rear leveling screw 124c while keeping the other two leveling screws 124a and 124b stationary, the transmitter/receiver unit 106 will be tilted upward or downward, thereby varying the angle at which the beam is transmitted. This feature allows adjustment of the tilt angle of the transmitter/receiver unit to ensure that the beam emitted from the unit will always be parallel to the plane of the wafers.

Rotational adjustment plate 120 includes a pivot screw 126 and a screw 128 fitting within a slot (not shown). The slot allows the position of the rotational adjustment plate 120 to be pivoted about an axis through pivot screw 126 so as to adjust the orientation of the transmitter/receiver unit 106 in the plane of the wafer. Once the unit is properly positioned so that a beam from the transmitter reflected off the wafer is received in the receiver, the screws 126 and 128 may be tightened to fix the position of the unit 106 in place. The rotational adjustment plate includes a central opening 129 for receiving the transmitter/receiver unit 106. The opening 129 is large enough to allow adjustment of the tilt angle of the unit 106 therein by the leveling screws 124a–c as described above.

Figure 19:
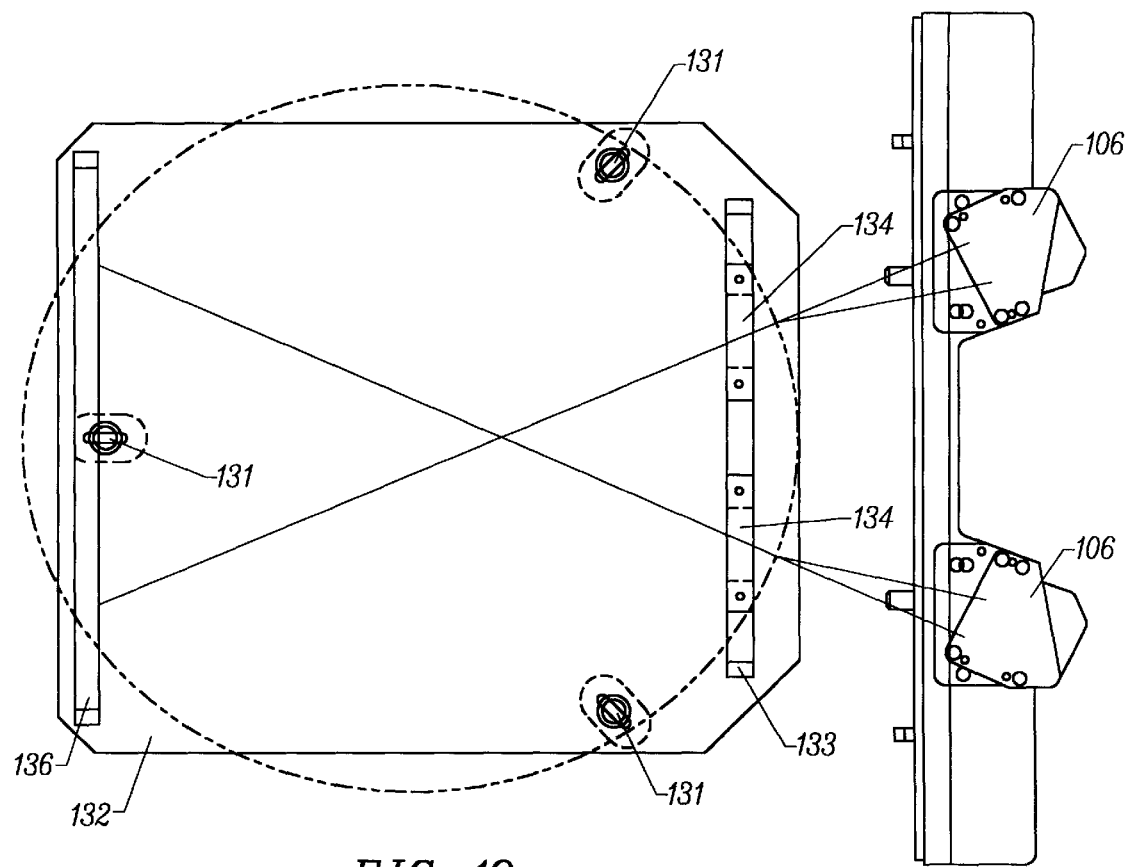
FIG. 19 is a top view of a calibration plate and a wafer mapping system according to the present invention.
Figure 20:
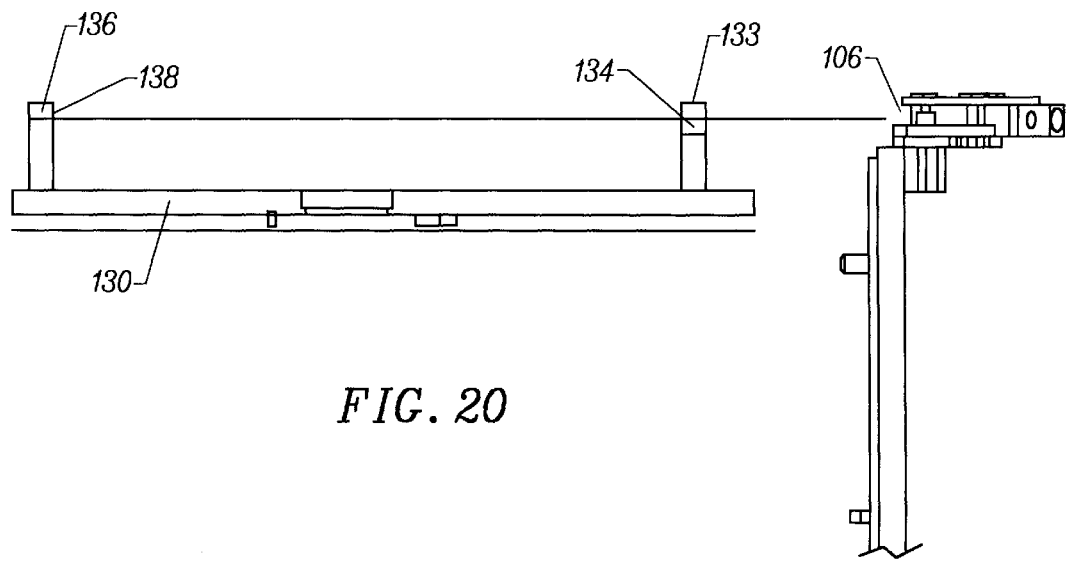
FIG. 20 is a side view of a calibration plate and a wafer mapping system according to the present invention.

In order to ensure that the beam emitted from the transmitter of each of the units 106 is both at the proper elevation with respect to the port door and is parallel to the plane of the wafers, the system is initially calibrated with the use of a calibration plate 130 as shown in FIGS. 19 and 20. As shown therein, the plate 130 is initially seated on kinematic pins 131 of a load port 132 onto which a pod 26 is to be loaded. The calibration plate 130 includes a wall 133 including a number of slots 134 at a predetermined height. The calibration plate further includes a second wall 136 including a groove 138, which is provided at the same height as slot 134.

In the calibration operation, a beam from each of the units 106 is transmitted toward the plate 130. If the beam passes through the slot 134 and lands within the groove 138, the beam is both at the proper height and parallel to the horizontal datum plane and the wafers. If the beam is below or above the slot 134, each of the three leveling screws 124a–c may be adjusted until the height of the beam is at the height of the slot 134. If the beam passes through the slot 134 but does not contact wall 136 at groove 138, then the beam is not parallel to the horizontal surface of the wafers, and either the front leveling screws 124a and 124b or the rear leveling screw 124c needs to be adjusted to tilt the transmitter/receiver unit 106 until the beam is horizontal. The planarity of the units 106 in the horizontal datum plane is also checked to ensure that the receiver in each unit is at the same elevation as the transmitter. After the beam has been calibrated, the calibration plate may be removed and the wafer mapping system according to the present invention is ready for use. A preferred embodiment of the invention works with an electromagnetic frequency in the visible range, so that the height and planarity of the beam may be seen. It is understood that the groove 138 may be replaced by other sensing mechanisms to detect beams having a frequency outside of the visible range.

Adjustment mechanisms similar to those described above for transmitter/receiver units 106 may also be utilized in the various embodiments of the break-the-beam mapping system described with reference to FIGS. 1 through 14. In particular, the transmitter 44 and/or receiver 53 may be mounted to a support plate, which is in turn mounted to a rotational adjustment plate by a plurality of locking and leveling screws. In this manner, the transmitter 44 and receiver 53 are capable of being adjustably rotated about a vertical axis, and the height and horizontal planarity of the beam may also be adjusted. Moreover, a calibration plate may also be utilized to initially calibrate the position and planarity of the transmitter 44, and the planarity of the receiver with respect to the transmitter may be checked to ensure they both lie in the same horizontal plane.

The invention has been described thus far as mapping the wafers as the port door moves downward. However, the present invention may additionally or alternatively operate as the port door moves upward. In particular, after wafers have been processed in tool 20 and have been returned to the pod, the various embodiments of the wafer mapping system as described above may be used to map wafers in the pod as the port door 22 moves upwards in preparation for covering access port 24. This process ensures that the wafers have been returned to their proper slot. Additionally, in a sealed SMIF pod, a wafer retention mechanism is located in the pod door, which device includes slots in which the respective wafers seat when the pod is sealed to secure the wafers in position during transport. If a wafer were returned to the pod in, for example, a cross slotted position, the wafer may break when the pod is sealed and the wafer retention mechanism engages the wafers. Mapping the wafers after they have been returned to the pod will detect a cross slotted wafer, whereupon the processes may be halted and the position of the cross slotted wafer fixed.

In a further alternative embodiment, instead of a break-the-beam or retroreflective sensor system, a video camera such as a charge coupled display (CCD) camera may be mounted on top of the port door to retrieve a video image of the wafers within the cassette as the port door moves downward. The video image and the known height of the door as it moves downward may be used to identify the presence and position of wafers within the wafer cassette.

The invention as described above comprises a sensing system located on the top of a port door to sense information with respect to one or more wafers in a pod shell as the port door moves downward. It is further understood that the invention may also operate where the port door is configured to move back out of the access port 24, and then move upwards away from the access port. In such an embodiment, the sensing system could be located on the bottom edge of the port door.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

We claim:

1. A system for mapping positional information of a plurality of workpieces seated in a container on a load port of a tool for processing the plurality of workpieces, the system comprising:
   wherein said load port including an access port through which the plurality of workpieces are transferred, and a port door capable of covering the access port and capable of moving in a vertical direction relative to the workpieces, away from the access port;
   a transmitter mounted on the port door and moving with the port door, said transmitter capable of transmitting a beam into the container;
   a receiver mounted on the port door and moving with the port door, said receiver capable of receiving said beam and said receiver capable of indicating a first state when said receiver receives said beam and said receiver capable of indicating a second state when said receiver does not receive said beam; and means for determining the positional information of the plurality of workpieces base on a switching of said receiver between said first and second states.

2. A system for mapping the positional information of a plurality of workpieces as recited in claim 1, wherein said means for determining the positional information of the plurality of workpieces determines the position of the plurality of workpieces when said receiver switches from said first state to said second state.

3. A system for mapping the positional information of a plurality of workpieces as recited in claim 1, wherein said means for determining the positional information of the plurality of workpieces determines the position of the plurality of workpieces when said receiver switches from said second state to said first state.

4. A system for mapping positional information of a plurality of workpieces seated in a container on a load port of a tool for processing the plurality of workpieces, the system comprising:

wherein said load port including an access port through which the plurality of workpieces are transferred, and a port door capable of covering the access port and capable of moving in a vertical direction relative to the workpieces, away from the access port;

a transmitter mounted on the port door and moving with the port door, said transmitter capable of transmitting a beam into the container;

a receiver mounted on the port door and moving with the port door, said receiver capable of receiving said beam and said receiver capable of indicating a first state when said receiver receives said beam and said receiver capable of indicating a second state when a workpiece prevents said beam from being received in said receiver; and means for determining the positional information of the plurality of workpieces based on a switching of said receiver between said first and second states.

5. A system for mapping positional information of a plurality of workpieces as recited in claim 4, further comprising:

a first finger mounted on and moving with the port door, said first finger capable of occupying a retracted position where said first finger does not extend into the container, and an extended position where said first finger extends into the container; and a second finger mounted on and moving with the port door, said second finger capable of occupying a retracted position where said second finger does not extend into the container, and an extended position where said second finger extends into the container;

wherein said transmitter is mounted on said first finger; and wherein said receiver is mounted on said second finger.

6. A system for mapping the positional information of a plurality of workpieces as recited in claim 5, wherein said first finger and said second finger are actively driven between their retracted and extended positions.

7. A system for mapping the positional information of a plurality of workpieces as recited in claim 5, wherein said first finger and said second finger are passively driven between their retracted and extended positions.

8. A system for mapping positional information of a plurality of workpieces as recited in claim 4, further comprising at least one reflective surface provided within the container for receiving the beam from said transmitter and reflecting said beam to said receiver in the event said beam is not blocked by the workpiece.

9. A system for mapping positional information of a plurality of workpieces as recited in claim 4, further comprising at least one reflective surface provided outside of the container for receiving the beam from said transmitter and reflecting said beam to said receiver in the event said beam is not blocked by the workpiece.

10. A system for mapping positional information of a plurality of workpieces as recited in claim 4, wherein said transmitter and said receiver are mounted on a top of the port door.

11. A system for mapping positional information of a plurality of workpieces seated in a container on a load port of a tool for processing workpieces, the system comprising:

wherein said load port including an access port through which the workpieces are transferred, and a port door capable of covering the access port and capable of moving in a vertical direction relative to the workpieces, away from the access port;

a transmitter mounted on the port door and moving with the port door, said transmitter capable of transmitting a beam into the container;

a receiver mounted on the port door and moving with the port door, said receiver capable of receiving said beam when said beam reflects off of a workpiece of the plurality of workpieces, and said receiver capable of indicating a first state when said receiver receives said beam and said receiver capable of indicating a second state when said receiver does not receive said beam; and means for determining the positional information of the plurality of workpieces based on a switching of said receiver between said first and second states.

12. A system for sensing information with regard to at least one workpiece within a container located on a load port of a tool for processing the at least one workpiece, the system comprising:

wherein said load port including a port plate having an access port through which the at least one workpiece is transferred, and a port door capable of covering the access port and moving in a vertical direction relative to the at least one workpiece, away from the access port;

a sensor mounted on the port door and moving with the port door, said sensor sensing information with regard to the at least one workpiece; and means for interpreting said information.

13. A system for sensing information with regard to at least one workpiece within a container located on a load port of a tool for processing the at least one workpiece as recited in claim 12, further comprising:

a first finger having a first end rotationally mounted on a first portion of an upper edge of the port door;

a second finger having a first end rotationally mounted on a second portion of said upper edge of the port door; and a drive system for rotating said first and second fingers between a first position where said first and second fingers extend into the container, and a second position where said first and second fingers do not extend into the container.

14. A system for sensing information with regard to at least one workpiece within a container located on a load port of a tool for processing the at least one workpiece as recited in claim 13, said sensor comprising a transmitter for emitting a beam and a receiver for receiving said beam, said transmitter being located near a second end of said first finger opposite said first end of said first finger, and said receiver being located near a second end of said second finger opposite said first end of said second finger.

15. A system for sensing information with regard to at least one workpiece within a container located on a load port of a tool for processing the at least one workpiece as recited in claim 13, said sensor comprising a transmitter mounted on said edge of the port door for emitting a beam and a receiver mounted on said edge of the port door for receiving said beam, said system further including:
- a first reflective surface located near a second end of said first finger opposite said first end of said first finger, and
- a second reflective surface located near a second end of said second finger opposite said first end of said second finger,
- wherein said first and second reflective surfaces transfer said beam from said transmitter to said receiver.

16. A system for sensing information with regard to at least one workpiece within a container located on a load port of a tool for processing the at least one workpiece as recited in claim 13, wherein said drive system comprises a motor operatively connected to said first and second fingers for rotating said first and second fingers between said first and second positions.

17. A system for sensing information with regard to at least one workpiece within a container located on a load port of a tool for processing the at least one workpiece as recited in claim 13, wherein said drive system includes:
- a first extension having a first end affixed to said first finger, said first extension being rotatable with said first finger;
- first biasing means for exerting a first biasing force on said first finger biasing said first finger into said second position;
- a first magnet affixed to a second end of said first extension opposite said first end of said first extension;
- a first magnetic strip vertically oriented along a first vertical side of the port plate, said first magnetic strip capable of exerting a first repulsive force on said first magnet;
- a second extension having a first end affixed to said second finger, said second extension being rotatable with second finger;
- second biasing means for exerting a second biasing force on said second finger biasing said second finger into said second position;
- a second magnet affixed to a second end of said second extension opposite said first end of said second extension;
- a second magnetic strip vertically oriented along a second vertical side of the port plate, said second magnetic strip capable of exerting a second repulsive force on said second magnet;
- wherein, upon movement of the port door in said vertical direction, said first finger moves from said second position to said first position upon said first repulsive force exceeding said first biasing force, and said second finger moves from said second position to said first position upon said second repulsive force exceeding said second biasing force.

18. A system for sensing information with regard to at least one workpiece within a container located on a load port of a tool for processing the at least one workpiece as recited in claim 17, wherein, upon movement of the port door in said vertical direction, said first finger moves from said second position to said first position upon said first repulsive force exceeding said first biasing force, and said second finger moves from said second position to said first position upon said second repulsive force exceeding said second biasing force.

19. A system for sensing information with regard to at least one workpiece within a container located on a load port of a tool for processing the at least one workpiece as recited in claim 13, wherein said drive system includes:
- a first shaft vertically mounted through a first portion of the port door, said first finger affixed to a first end of said first shaft;
- first biasing means for exerting a first biasing force on said first finger biasing said first finger into said second position;
- a first extension affixed to a second end of said first shaft opposite said first end of said first shaft;
- a first ramp vertically oriented along a first vertical side of the port plate, said first ramp extending away from a plane of the port plate;
- a second shaft vertically mounted through a second portion of the port door, said second finger affixed to a top portion of said second shaft;
- second biasing means for exerting a second biasing force on said second finger biasing said second finger into said second position;
- a second extension affixed to a second end of said second shaft opposite said first end of said second shaft;
- a second ramp vertically oriented along a second vertical side of the port plate, said second ramp extending away from said plane of the port plate;
- wherein, upon movement of the port door in said vertical direction, said first finger moves from said second position to said first position upon engagement of said first extension with said first ramp, and said second finger moves from said second position to said first position upon engagement of said second extension with said second ramp.

20. A system for sensing information with regard to at least one workpiece within a container located on a load port of a tool for processing the at least one workpiece as recited in claim 19, wherein, upon movement of the port door in said vertical direction, said first finger moves from said first position to said second position upon disengagement of said first extension with said first ramp, and said second finger moves from said first position to said second position upon disengagement of said second extension with said second ramp.

21. A system for sensing information with regard to at least one workpiece within a container located on a load port of a tool for processing the at least one workpiece, the system comprising:
- wherein said load port including an access port through which the at least one workpiece is transferred, and a port door capable of covering the access port and moving in a vertical direction away from the access port;
- a transmitter mounted on the port door and moving with the port door, said transmitter emitting a beam;

a receiver mounted on the port door and moving with the port door, said receiver receiving said beam; and at least one reflective strip within the container for receiving said beam from said transmitter and redirecting said beam to said receiver.

22. A system for sensing information with regard to at least one workpiece within a container located on a load port of a tool for processing the at least one workpiece, the system comprising:

wherein said load port including a port plate having an access port through which the at least one workpiece is transferred, and a port door capable of covering the access port and moving in a vertical direction relative to the at least one workpiece, away from the access port;

a transmitter mounted on the port door and moving with the port door, said transmitter emitting a beam;

a receiver mounted on the port door and moving with the port door, said receiver receiving said beam; and at least one reflective strip vertically mounted on the load port for receiving said beam from said transmitter and redirecting said beam to said receiver.

23. A system for sensing information with regard to at least one workpiece within a container located on a load port of a tool for processing the at least one workpiece as recited in claim 22, further including a plurality of reflectors mounted on the port plate for redirecting at least a portion of said beam around a perimeter of the access port to create a sensing window around the access port.

* * * * *

UNITED STATES PATENT AND TRADEMARK OFFICE
CERTIFICATE OF CORRECTION

PATENT NO. : 6,188,323 B1
DATED : February 13, 2001
INVENTOR(S) : Rosenquist et al.

It is certified that error appears in the above-identified patent and that said Letters Patent is hereby corrected as shown below:

Column 18, claim 1,
Line 54, delete the phrase "wherein said load port including an access port through which the plurality of workpieces are transferred, and a port door capable of covering the access port and capable of moving in a vertical direction relative to the workpieces, away from the access port;"

Column 19, claim 1,
Line 3, immediately following the phrase, "... said first and second states" insert the phrase -- wherein said load port includes an access port through which the plurality of workpieces are transferred, and a port door capable of covering the access port and capable of moving in a vertical direction relative to the workpieces, away from the access port -- as an indented phrase.

Column 19, claim 4,
Line 19, delete the phrase "wherein said load port including an access port through which the plurality of workpieces are transferred, and a port door capable of covering the access port and capable of moving in a vertical direction relative to the workpieces, away from the access port;"
Line 37, immediately following the phrase, "... said first and second states" insert the phrase -- wherein said load port includes an access port through which the plurality of workpieces are transferred, and a port door capable of covering the access port and capable of moving in a vertical direction relative to the workpieces, away from the access port; --.

Column 20, claim 11,
Line 14, delete the phrase "wherein said load port including an access port through which the workpieces are transferred, and a port door capable of covering the access port and capable of moving in a vertical direction relative to the workpieces, away from the access port;"
Line 33, immediately following the phrase, "... said first and second states" insert the phrase -- wherein said load port includes an access port through which the workpieces are transferred, and a port door capable of covering the access port and capable of moving in a vertical direction relative to the workpieces, away from the access port; --.

Column 20, claim 12,
Line 38, delete the phrase "wherein said load port including a port plate having an access port through which the at least one workpiece is transferred, and a port door capable of covering the access port and moving in a vertical direction relative to the at least one workpiece, away from the access port;"

UNITED STATES PATENT AND TRADEMARK OFFICE
CERTIFICATE OF CORRECTION

PATENT NO. : 6,188,323 B1
DATED : February 13, 2001
INVENTOR(S) : Rosenquist et al.

It is certified that error appears in the above-identified patent and that said Letters Patent is hereby corrected as shown below:

<u>Column 20, claim 12,</u>
Line 47, immediately following the phrase, "means for interpreting said information" insert the phrase -- wherein said load port includes a port plate having an access port through which the at least one workpiece is transferred, and a port door capable of covering the access port and moving in a vertical direction relative to the at least one workpiece, away from the access port; --.

Signed and Sealed this

Ninth Day of April, 2002

Attest:

*Attesting Officer*

JAMES E. ROGAN
*Director of the United States Patent and Trademark Office*